United States Patent
Suh et al.

(10) Patent No.: US 8,344,424 B2
(45) Date of Patent: Jan. 1, 2013

(54) ENHANCEMENT MODE GALLIUM NITRIDE POWER DEVICES

(75) Inventors: Chang Soo Suh, Goleta, CA (US); Umesh Mishra, Montecito, CA (US)

(73) Assignee: Transphorm Inc., Goleta, CA (US)

( * ) Notice: Subject to any disclaimer, the term of this patent is extended or adjusted under 35 U.S.C. 154(b) by 0 days.

(21) Appl. No.: 13/406,723

(22) Filed: Feb. 28, 2012

(65) Prior Publication Data

US 2012/0175680 A1 Jul. 12, 2012

Related U.S. Application Data

(62) Division of application No. 13/019,150, filed on Feb. 1, 2011, now Pat. No. 8,193,562, which is a division of application No. 11/856,687, filed on Sep. 17, 2007, now Pat. No. 7,915,643.

(51) Int. Cl.
*H01L 29/66* (2006.01)

(52) U.S. Cl. ............. 257/194; 257/20; 257/24; 257/27; 257/192; 257/195; 257/E29.246; 257/E29.247; 257/E29.248; 257/E29.249; 257/E29.25; 257/E29.251; 257/E29.252; 257/E29.253; 257/E29.254

(58) Field of Classification Search ............... 257/20, 257/24, 27, 192, 194–195, E29.246–E29.254
See application file for complete search history.

(56) References Cited

U.S. PATENT DOCUMENTS

| | | | |
|---|---|---|---|
| 4,645,562 A | 2/1987 | Liao et al. |
| 4,728,826 A | 3/1988 | Einzinger et al. |
| 4,821,093 A | 4/1989 | Iafrate et al. |
| 4,914,489 A | 4/1990 | Awano |
| 5,329,147 A | 7/1994 | Vo et al. |
| 5,646,069 A | 7/1997 | Jelloian et al. |
| 5,705,847 A | 1/1998 | Kashiwa et al. |
| 5,714,393 A | 2/1998 | Wild et al. |
| 6,008,684 A | 12/1999 | Ker et al. |
| 6,097,046 A | 8/2000 | Plumton |
| 6,316,793 B1 | 11/2001 | Sheppard et al. |
| 6,867,078 B1 | 3/2005 | Green et al. |
| 6,897,495 B2 | 5/2005 | Yoshida et al. |
| 6,979,863 B2 | 12/2005 | Ryu |
| 7,030,428 B2 | 4/2006 | Saxler |
| 7,071,498 B2 | 7/2006 | Johnson et al. |
| 7,084,475 B2 | 8/2006 | Shelton et al. |
| 7,268,375 B2 | 9/2007 | Shur et al. |
| 7,304,331 B2 | 12/2007 | Saito et al. |
| 7,321,132 B2 | 1/2008 | Robinson et al. |
| 7,501,669 B2 | 3/2009 | Parikh et al. |

(Continued)

FOREIGN PATENT DOCUMENTS

CN 1748320 3/2006

(Continued)

OTHER PUBLICATIONS

Arulkumaran et al. (2005), "Enhancement of breakdown voltage by AlN buffer layer thickness in AlGaN/GaN high-electron-mobility transistors on 4 in. diameter silicon," Applied Physics Letters, 86:123503-1-3.

Ando et al., "10-W/mm AlGaN-GaN HFET with a field modulating plate," IEEE Electron Device Letters, 2003, 24(5):289-291.

Authorized officer Chung Keun Lee, International Search Report and Written Opinion in PCT/US2008/076079, mailed Mar. 20, 2009, 11 pages.

(Continued)

*Primary Examiner* — Bac Au

(74) *Attorney, Agent, or Firm* — Fish & Richardson P.C.

(57) ABSTRACT

Enhancement mode III-nitride devices are described. The 2DEG is depleted in the gate region so that the device is unable to conduct current when no bias is applied at the gate. Both gallium face and nitride face devices formed as enhancement mode devices.

9 Claims, 23 Drawing Sheets

U.S. PATENT DOCUMENTS

| | | | |
|---|---|---|---|
| 7,566,918 B2 | 7/2009 | Wu et al. |
| 7,777,252 B2 | 8/2010 | Sugimoto et al. |
| 7,795,642 B2 | 9/2010 | Suh et al. |
| 7,851,825 B2 | 12/2010 | Suh et al. |
| 7,875,907 B2 | 1/2011 | Honea et al. |
| 7,884,394 B2 | 2/2011 | Wu et al. |
| 7,893,500 B2 | 2/2011 | Wu et al. |
| 7,898,004 B2 | 3/2011 | Wu et al. |
| 7,915,643 B2 | 3/2011 | Suh et al. |
| 7,939,391 B2 | 5/2011 | Suh et al. |
| 7,965,126 B2 | 6/2011 | Honea et al. |
| 2001/0032999 A1 | 10/2001 | Yoshida |
| 2001/0040247 A1 | 11/2001 | Ando |
| 2002/0036287 A1 | 3/2002 | Yu et al. |
| 2002/0121648 A1 | 9/2002 | Hsu et al. |
| 2003/0006437 A1 | 1/2003 | Mizuta et al. |
| 2003/0020092 A1 | 1/2003 | Parikh et al. |
| 2004/0041169 A1 | 3/2004 | Ren et al. |
| 2004/0061129 A1 | 4/2004 | Saxler et al. |
| 2004/0164347 A1 | 8/2004 | Zhao et al. |
| 2005/0077541 A1 | 4/2005 | Shen et al. |
| 2005/0133816 A1 | 6/2005 | Fan |
| 2005/0189561 A1 | 9/2005 | Kinzer et al. |
| 2005/0189562 A1 | 9/2005 | Kinzer et al. |
| 2005/0194612 A1 | 9/2005 | Beach |
| 2005/0253168 A1 | 11/2005 | Wu et al. |
| 2006/0011915 A1 | 1/2006 | Saito et al. |
| 2006/0043499 A1 | 3/2006 | De Cremoux et al. |
| 2006/0102929 A1 | 5/2006 | Okamoto et al. |
| 2006/0108602 A1 | 5/2006 | Tanimoto |
| 2006/0121682 A1 | 6/2006 | Saxler |
| 2006/0124962 A1 | 6/2006 | Ueda et al. |
| 2006/0157729 A1 | 7/2006 | Ueno et al. |
| 2006/0186422 A1 | 8/2006 | Gaska et al. |
| 2006/0189109 A1 | 8/2006 | Fitzgerald |
| 2006/0202272 A1 | 9/2006 | Wu et al. |
| 2006/0220063 A1 | 10/2006 | Kurachi et al. |
| 2006/0255364 A1 | 11/2006 | Saxler |
| 2006/0289901 A1 | 12/2006 | Sheppard et al. |
| 2007/0007547 A1 | 1/2007 | Beach |
| 2007/0018199 A1 | 1/2007 | Sheppard et al. |
| 2007/0018210 A1 | 1/2007 | Sheppard et al. |
| 2007/0045670 A1 | 3/2007 | Kuraguchi |
| 2007/0080672 A1 | 4/2007 | Yang |
| 2007/0128743 A1 | 6/2007 | Huang et al. |
| 2007/0134834 A1 | 6/2007 | Lee et al. |
| 2007/0145390 A1 | 6/2007 | Kuraguchi |
| 2007/0158692 A1 | 7/2007 | Nakayama et al. |
| 2007/0164315 A1 | 7/2007 | Smith et al. |
| 2007/0164322 A1 | 7/2007 | Smith et al. |
| 2007/0194354 A1 | 8/2007 | Wu et al. |
| 2007/0205433 A1 | 9/2007 | Parikh et al. |
| 2007/0224710 A1 | 9/2007 | Palacios et al. |
| 2007/0228477 A1 | 10/2007 | Suzuki et al. |
| 2007/0278518 A1 | 12/2007 | Chen et al. |
| 2008/0073670 A1 | 3/2008 | Yang et al. |
| 2008/0093626 A1 | 4/2008 | Kuraguchi |
| 2008/0157121 A1 | 7/2008 | Ohki |
| 2008/0203430 A1 | 8/2008 | Simin et al. |
| 2008/0230784 A1 | 9/2008 | Murphy |
| 2008/0237640 A1 | 10/2008 | Mishra et al. |
| 2008/0274574 A1 | 11/2008 | Yun |
| 2008/0283844 A1 | 11/2008 | Hoshi et al. |
| 2008/0308813 A1 | 12/2008 | Suh et al. |
| 2009/0032820 A1 | 2/2009 | Chen |
| 2009/0032879 A1 | 2/2009 | Kuraguchi |
| 2009/0072240 A1 | 3/2009 | Suh et al. |
| 2009/0072269 A1 | 3/2009 | Suh et al. |
| 2009/0075455 A1 | 3/2009 | Mishra |
| 2009/0085065 A1 | 4/2009 | Mishra et al. |
| 2009/0146185 A1 | 6/2009 | Suh et al. |
| 2009/0201072 A1 | 8/2009 | Honea et al. |
| 2009/0267078 A1 | 10/2009 | Mishra et al. |
| 2010/0067275 A1 | 3/2010 | Wang et al. |
| 2010/0073067 A1 | 3/2010 | Honea |
| 2010/0264461 A1 | 10/2010 | Rajan et al. |
| 2010/0289067 A1 | 11/2010 | Mishra et al. |
| 2011/0012110 A1 | 1/2011 | Sazawa et al. |
| 2011/0049526 A1 | 3/2011 | Chu et al. |
| 2011/0101466 A1 | 5/2011 | Wu |
| 2011/0121314 A1 | 5/2011 | Suh et al. |
| 2011/0127541 A1 | 6/2011 | Wu et al. |
| 2011/0140172 A1 | 6/2011 | Chu et al. |
| 2011/0169549 A1 | 7/2011 | Wu |
| 2011/0193619 A1 | 8/2011 | Parikh et al. |
| 2011/0249477 A1 | 10/2011 | Honea et al. |

FOREIGN PATENT DOCUMENTS

| | | |
|---|---|---|
| CN | 101897029 | 11/2010 |
| CN | 102017160 | 4/2011 |
| EP | 1 998 376 | 12/2008 |
| EP | 2 188 842 | 5/2010 |
| JP | 2000-058871 | 2/2000 |
| JP | 2003-229566 | 8/2003 |
| JP | 2003-244943 | 8/2003 |
| JP | 2004-260114 A | 9/2004 |
| JP | 2006-32749 A | 2/2006 |
| JP | 2006-033723 | 2/2006 |
| JP | 2007-036218 | 2/2007 |
| JP | 2007-215331 | 8/2007 |
| JP | 2008/199771 | 8/2008 |
| JP | 2010-539712 | 12/2010 |
| TW | 200924068 | 6/2009 |
| TW | 200924201 | 6/2009 |
| TW | 200947703 | 11/2009 |
| TW | 201010076 | 3/2010 |
| TW | 201027912 | 7/2010 |
| TW | 2010278759 | 7/2010 |
| TW | 201036155 | 10/2010 |
| WO | WO 2007/108404 | 9/2007 |
| WO | WO 2008/120094 | 10/2008 |
| WO | WO 2009/036181 | 3/2009 |
| WO | WO 2009/036266 | 3/2009 |
| WO | WO 2009/039028 | 3/2009 |
| WO | WO 2009/039041 | 3/2009 |
| WO | WO 2009/076076 | 6/2009 |
| WO | WO 2009/132039 | 10/2009 |
| WO | WO 2010-039463 | 4/2010 |
| WO | WO 2010/068554 | 6/2010 |
| WO | WO 2010/090885 | 8/2010 |
| WO | WO 2010/132587 | 11/2010 |
| WO | WO 2011/031431 | 3/2011 |
| WO | WO 2011/072027 | 6/2011 |

OTHER PUBLICATIONS

Authorized officer Nora Lindner, International Preliminary Report on Patentability in PCT/US2008/076079, mailed Apr. 1, 2010, 6 pages.

Authorized officer Keon Hyeong Kim, International Search Report and Written Opinion in PCT/US2008/076160, mailed Mar. 18, 2009, 11 pages.

Authorized officer Dorothée Mülhausen, International Preliminary Report on Patentability for application No. PCT/US2008/076199, mailed Apr. 1, 2010.

Authorized officer Keon Hyeong Kim, International Search Report and Written Opinion in PCT/US2008/085031, mailed Jun. 24, 2009, 11 pages.

Authorized officer Yolaine Cussac, International Preliminary Report on Patentability in PCT/US2008/085031, mailed Jun. 24, 2010, 6 pages.

Authorized officer Tae Hoon Kim, International Search Report and Written Opinion in PCT/US2009/041304, mailed Dec. 18, 2009, 13 pages.

Authorized officer Dorothée Mülhausen, International Preliminary Report on Patentability in PCT/US2009/041304, mailed Nov. 4, 2010, 8 pages.

Authorized officer Sung Hee Kim, International Search Report and Written Opinion in PCT/US2009/057554, mailed May 10, 2010, 13 pages.

Authorized officer Gijsbertus Beijer, International Preliminary Report on Patentability in PCT/US2009/057554, mailed Apr. 7, 2011, 7 pages.

Authorized officer Cheon Whan Cho, International Search Report and Written Opinion in PCT/US2009/066647, mailed Jul. 1, 2010, 16 pages.

Authorized officer Athina Nikitas-Etienne, International Preliminary Report on Patentability in PCT/US2009/066647, mailed Jun. 23, 2011, 12 pages.
Authorized officer Chung Keun Lee, International Search Report and Written Opinion in PCT/US2009/076030, mailed Mar. 23, 2009, 10 pages.
Authorized officer Yolaine Cussac, International Preliminary Report on Patentability in PCT/US2009/076030, Mar. 25, 2010, 5 pages.
Authorized officer Sung Chan Chung, International Search Report and Written Opinion in PCT/US2010/021824, mailed Aug. 23, 2010, 9 pages.
Authorized officer Sang Ho Lee, International Search Report and Written Opinion in PCT/US2010/034579, mailed Dec. 24, 2010, 9 pages.
Authorized officer Jeongmin Choi, International Search Report and Written Opinion in PCT/US2010046193, mailed Apr. 26, 2011, 13 pages.
Authorized officer Sang Ho Lee, International Search Report and Written Opinion in PCT/US2010/059486, mailed Jul. 26, 2011, 9 pages.
Barnett and Shinn (1994), "Plastic and elastic properties of compositionally modulated thin films," Annu. Rev. Mater. Sci., 24:481-511.
Chen et al., "High-performance AlGaN/GaN lateral field-effect rectifiers compatible with high electron mobility transistors," Jun. 25, 2008, Applied Physics Letters, 92, 253501-1-3.
Cheng et al. (2006), "Flat GaN epitaxial layers grown on Si(111) by metalorganic vapor phase epitaxy using step-graded AlGaN intermediate layers," Journal of Electronic Materials, 35(4):592-598.
Coffie, R.L., Characterizing and suppressing DC-to-RF dispersion in AlGaN/GaN high electron mobility transistors, 2003, PhD Thesis, University of California, Santa Barbara, 169 pp.
Coffie et al. (2003), "Unpassivated p-GaN/AlGaN/GaN HEMTs with 7.1 W/mm at 10 GhZ," Electronic Letters, 39(19):1419-1420.
Dora et al., "Zr02 gate dielectrics produced by ultraviolet ozone oxidation for GaN and AlGaN/GaN transistors," Mar./Apr. 2006, J. Vac. Sci. Technol. B, 24(2)575-581.
Dora et al., "High breakdown voltage achieved on AlGaN/GaN HEMTs with integrated slant field plates", Sep. 9, 006, IEEE Electron Device Letters, 27(9):713-715.
Fanciulli et al., "Structural and electrical properties of Hf02 films grown by atomic layer deposition on Si, Ge, GaAs and GaN," 2004, Mat. Res. Soc. Symp. Proc., vol. 786, 6 pp.
Green et al., "The effect of surface passivation on the microwave characteristics of undoped AlGaN/GaN HEMT's," IEEE Electron Device Letters, 2000, 21(6): 268-270.
Gu et al., "AlGaN/GaN MOS transistors using crystalline Zr02 as gate dielectric," 2007, Proceedings of SPIE, vol. 6473, 64730S-1-8.
International Search Report and Written Opinion of the International Searching Authority, International Application Serial No. PCT/US2008/076199, Mar. 24, 2009, 11 pp.
Karmalkar and Mishra (2001), "Enhancement of breakdown voltage in AlGaN/GaN high electron mobility transistors using a field plate," IEEE Transactions on Electron Devices, 48(8):1515-1521.
Karmalkar and Mishra, "Very high voltage AlGaN/GaN high electron mobility transistors using a field plate deposited on a stepped insulator," Solid-State Electronics, 2001, 45:1645-1652.
Keller et al. (2002), "GaN-GaN junctions with ultrathin AlN interlayers: expanding heterojunction design," Applied Physics Letters, 80(23):4387-4389.
Keller et al., "Method for heteroepitaxial growth of high quality N-Face GaN, InN and AlN and their alloys by metal organic chemical vapor deposition," U.S. Appl. No. 60/866,035, filed Nov. 15, 2006, 31 pages.
Khan et al., "AlGaN/GaN metal oxide semiconductor heterostructure field effect transistor," IEEE Electron Device Letters, 2000, 21(2):63-65.
Kumar et al., "High transconductance enhancement-mode AlGaN/GaN NEMTs on SiC substrate," Electronics Letters, 2003, 39(24): 2 pgs.

Kuraguchi et al. (2007), "Normally-off GaN-MISFET with well-controlled threshold voltage," Phys. Stats. Sol., 204(6):2010-2013.
Lanford et al., "Recessed-gate enhancement-mode GaN HEMT with high threshold voltage," Mar. 31, 2005, Electronics Letters, vol. 41, No. 7, 2 pages, Online No. 20050161.
Lee et al. (2001), "Self-aligned process for emitter- and base-regrowth GaN HBTs and BJTs," Solid-State Electronics, 45:243-247.
Marchand et al. (2001), "Metalorganic chemical vapor deposition of GaN on Si(111): stress control and application to field-effect transistors," Journal of Applied Physics, 89(12):7846-7851.
Mishra et al., "AlFaN/GaN HEMTs—An Overview of Device Operation and Applications," Proceedings of the IEEE, 2002, 90(6): 1022-1031.
Mishra et al., "N-face high electron mobility transistors with low buffer leakage and low parasitic resistance," U.S. Appl. No. 60/908,914, filed Mar. 29, 2007, 21 pages.
Mishra et al., "Polarization-induced barriers for n-face nitride-based electronics," U. S . Appl. No. 60/940,052, filed May 24, 2007, 29 pages.
Ota and Nozawa (2008), "AlGaN/GaN recessed MIS-Gate HFET with high threshold-voltage normally-off operation for power electronics applications," IEEE Electron Device Letters, 29(7):668-670.
Palacios et al., "Fluorine treatment to shape the electric field in electron devices, passivate dislocations and point defects, and enhance the luminescence efficiency of optical devices," U.S. Appl. No. 60/736,628, filed Nov. 15, 2005, 21 pages.
Palacios et al. (2006), "Nitride-based high electron mobility transistors with a GaN spacer," Applied Physics Letters, 89:073508-1-3.
Rajan et al., "Advanced transistor structures based on N-face GaN," 32nd International Symposium on Compound Semiconductors (ISCS), Sep. 18-22, 2005, Europa-Park Rust, Germany, 2 pages.
Rajan et al., "Method for Heteroepitaxial growth of high quality N-Face GaN, InN and AlN and their alloys by metal organic chemical vapor deposition," U.S. Appl. No. 60/866,035, filed Nov. 15, 2006, 31 pages.
Rajan et al., "N-polar aluminum gallium nitride/gallium nitride enhancement-mode field effect transistor," U.S. Appl. No. 11/523,286, filed Sep. 18, 2006, 23 pages.
Reiher et al. (2003), "Efficient stress relief in GaN heteroepitaxy on SiC (111) using low-temperature AlN interiayers," Journal of Crystal Growth, 248:563-567.
Saito et al., "Recess-gate structure approach toward normally off high-voltage AlGaN/GaN HEMT for power electronics applications," Feb. 2006, IEEE Transactions on Electron Device, 53(2):356-362.
Shelton et al., "Selective area growth and characterization of AlGaN/GaN heterojunction bipolar transistors by metalorganic chemical vapor deposition," IEEE Transactions on Electron Devices, 2001, 48(3): 490-494.
Shen, L., "Advanced polarization-based design of AlGaN/GaN HEMTs," Jun. 2004, PhD Thesis, University of California, Santa Barbara, 191 pp.
SIPO First Office Action for Application No. 200880120050.6, Aug. 2, 2011, 8 pages.
Suh et al., "High breakdown enhancement mode GaN-based HEMTs with integrated slant field plate," U.S. Appl. No. 60/822,886, filed Aug. 18, 2006, 16 pp.
Suh et al., "III-nitride devices with recessed gates," U.S. Appl. No. 60/972,481, filed Sep. 14, 2007, 18 pp.
Sugiura et al., "Enhancement-mode n-channel GaN MOSFETs fabricated on p-GaN using Hf02 as gate oxide," Aug. 16, 2007, Electronics Letters, vol. 43, No. 17, 2 pp.
Vetury et al. (1998), "Direct measurement of gate depletion in high breakdown (405V) Al/GaN/GaN heterostructure field effect transistors," IEDM 98, pp. 55-58.
Wang et al., "Comparison of the effect of gate dielectric layer on 2DEG carrier concentration in strained AlGaN/GaN heterostructure," 2005, Mater. Res. Soc. Symp. Proc., vol. 831, 6 pp.
Wang et al., "Enhancement-Mode Si3N4/AlGaN/GaN MISHFETs," IEEE Electron Device Letters, 2006, 27(10): 793-795.
Yoshida, S., "AlGan/GaN power FET," Furukawa Review, 21:7-11, 2002.

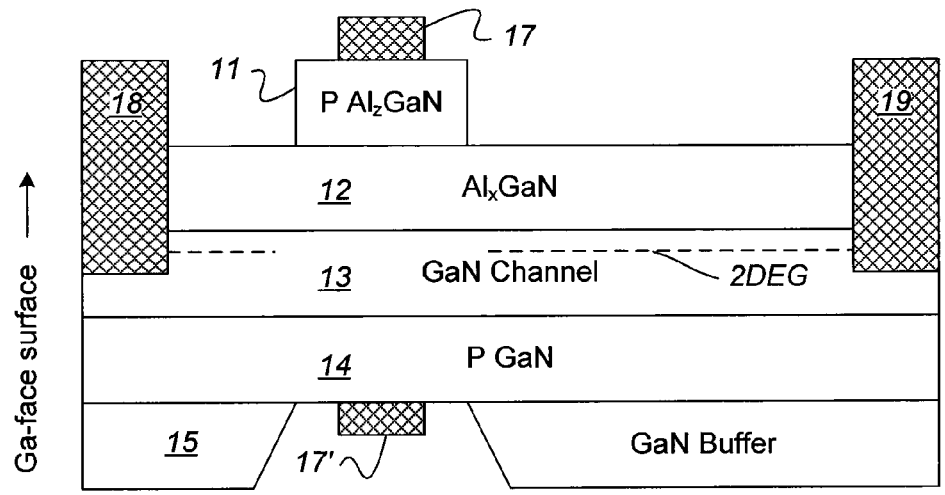
FIG._1
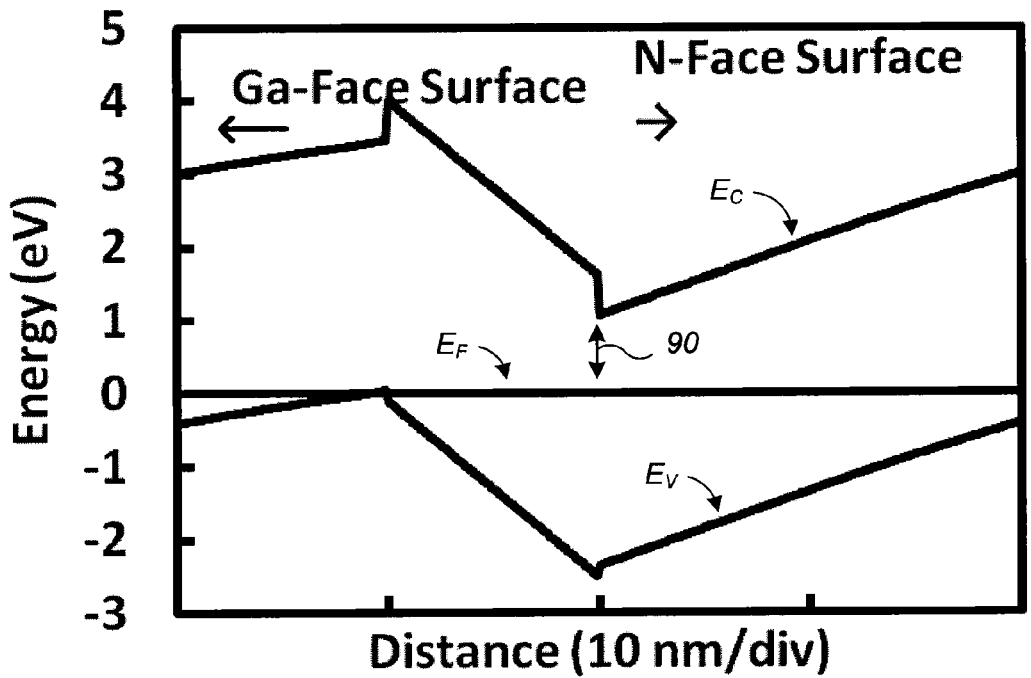
FIG._2

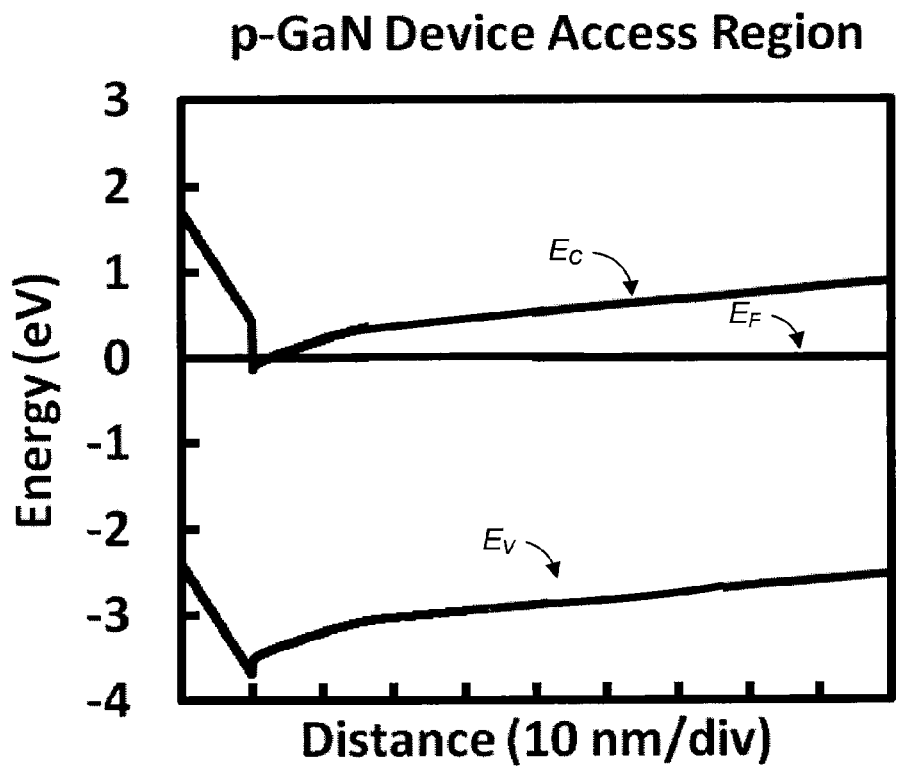
FIG._3
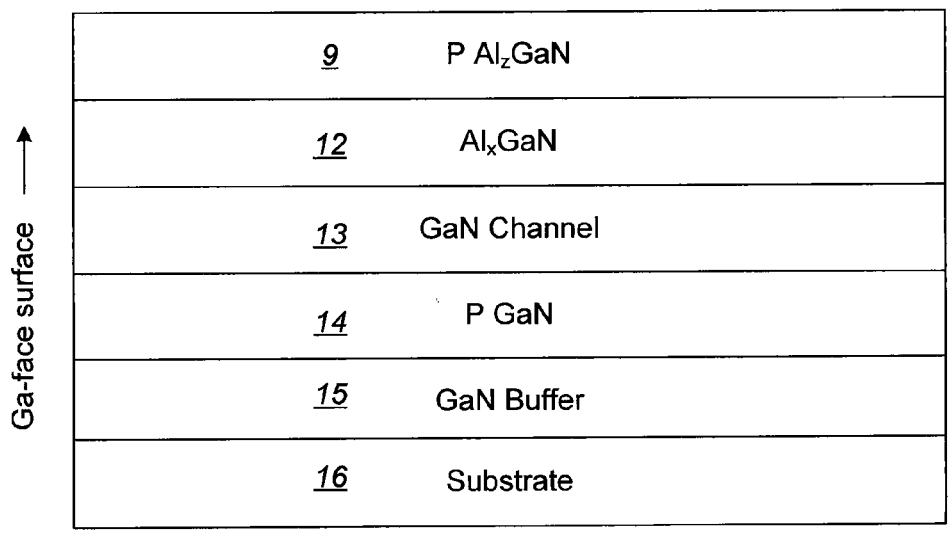
FIG._4

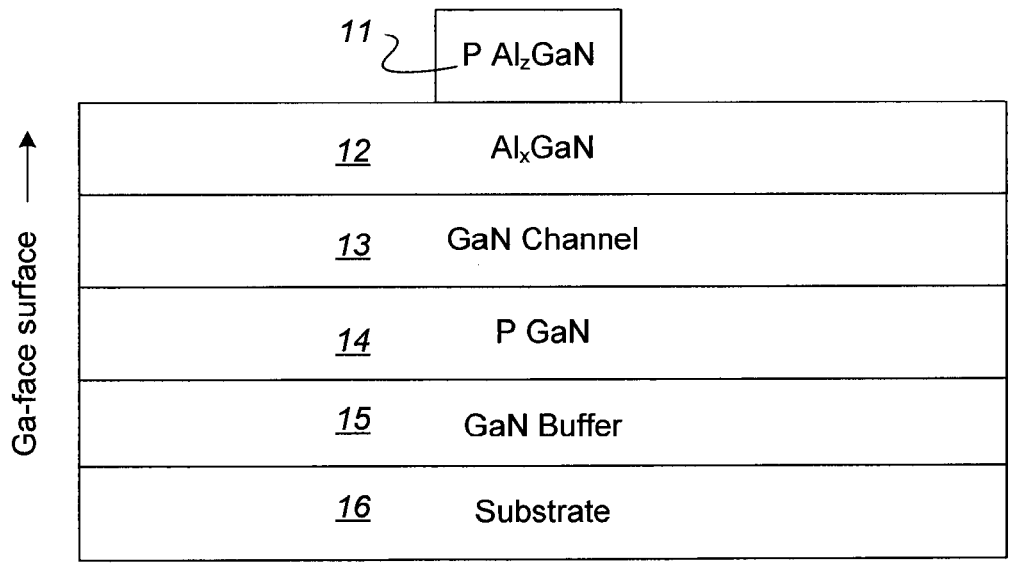
FIG._5
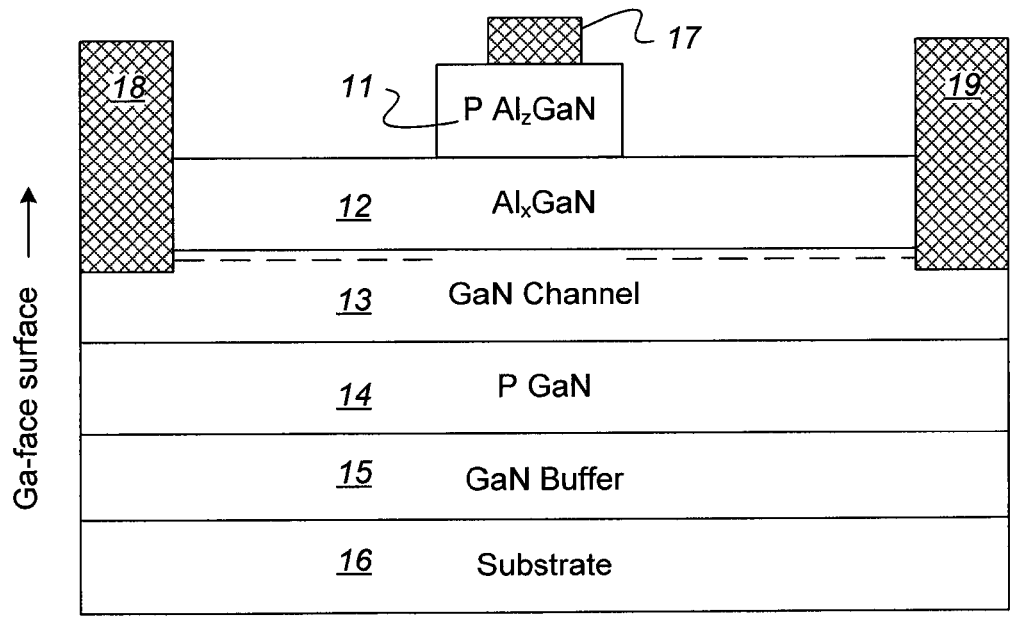
FIG._6

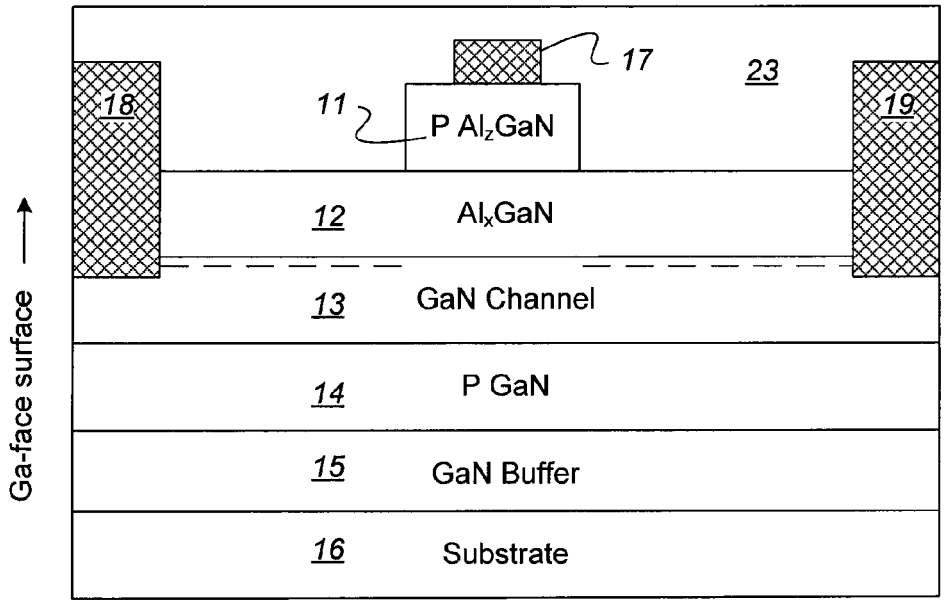
FIG._7
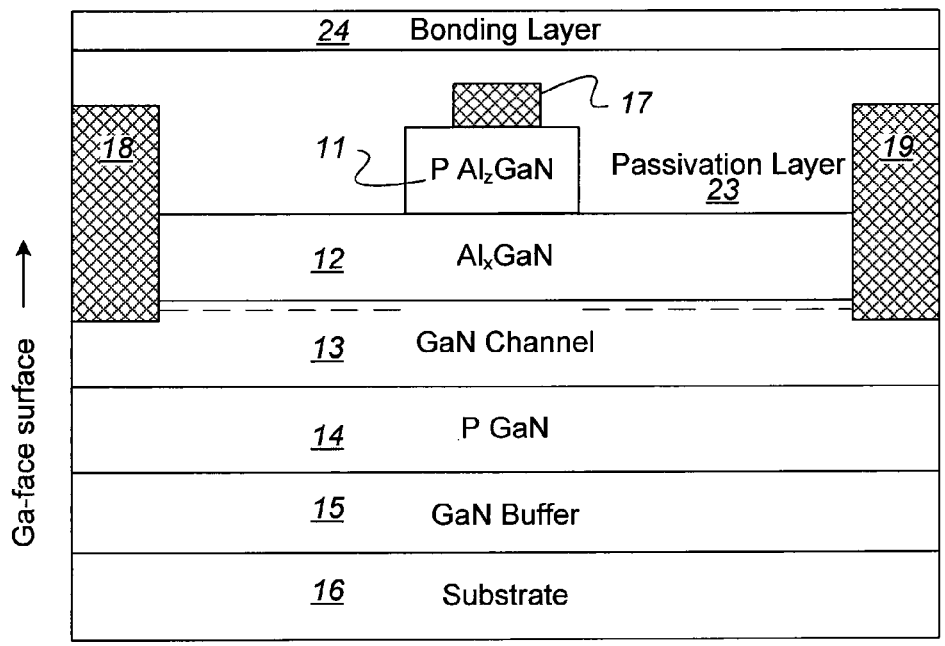
FIG._8

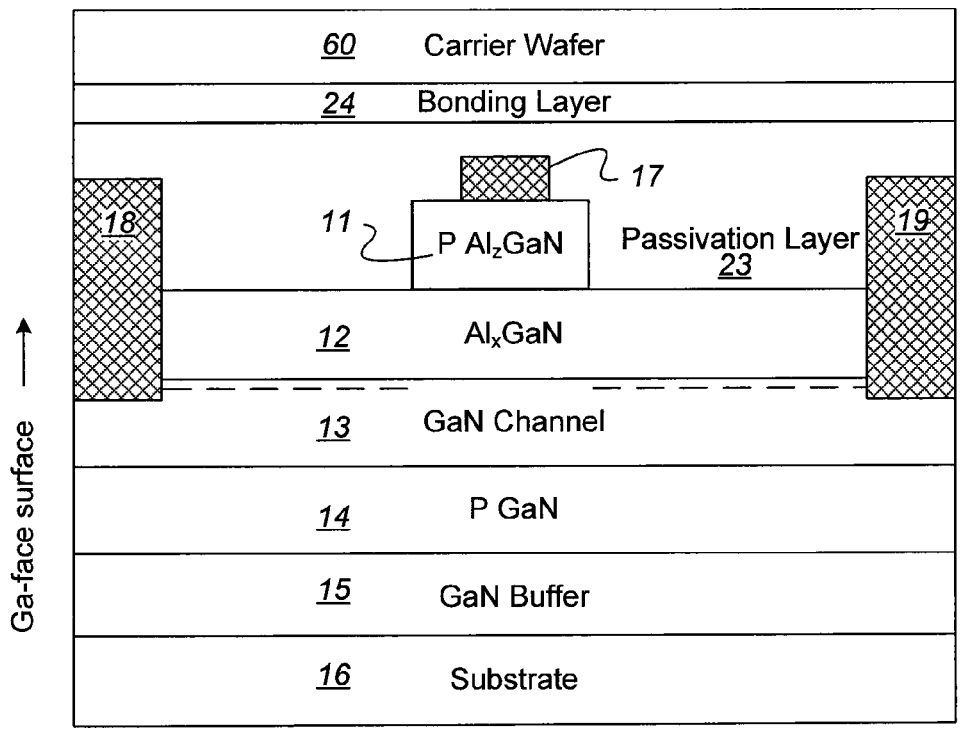
FIG._9
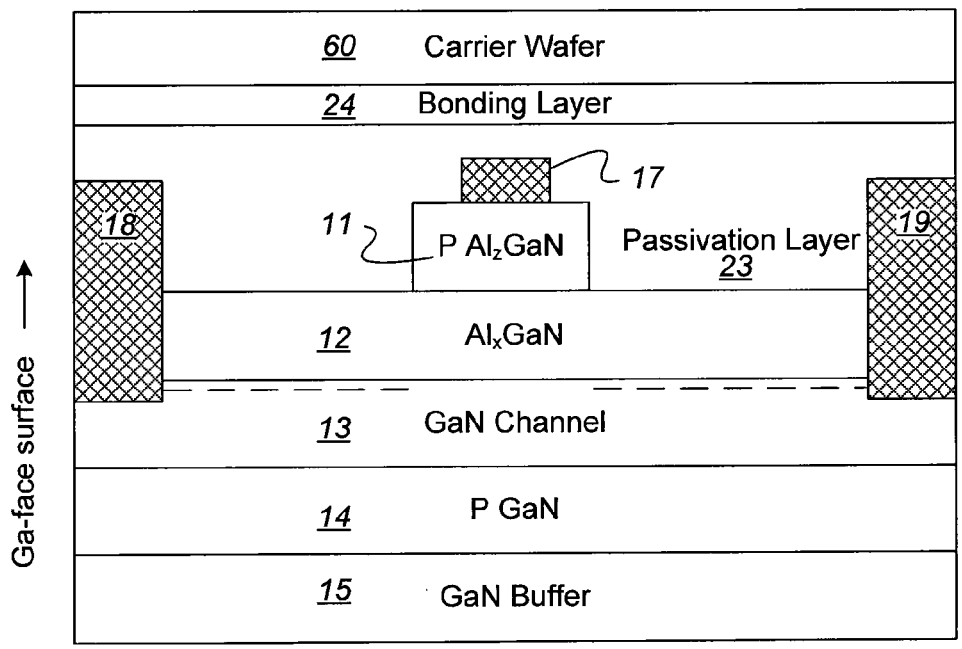
FIG._10

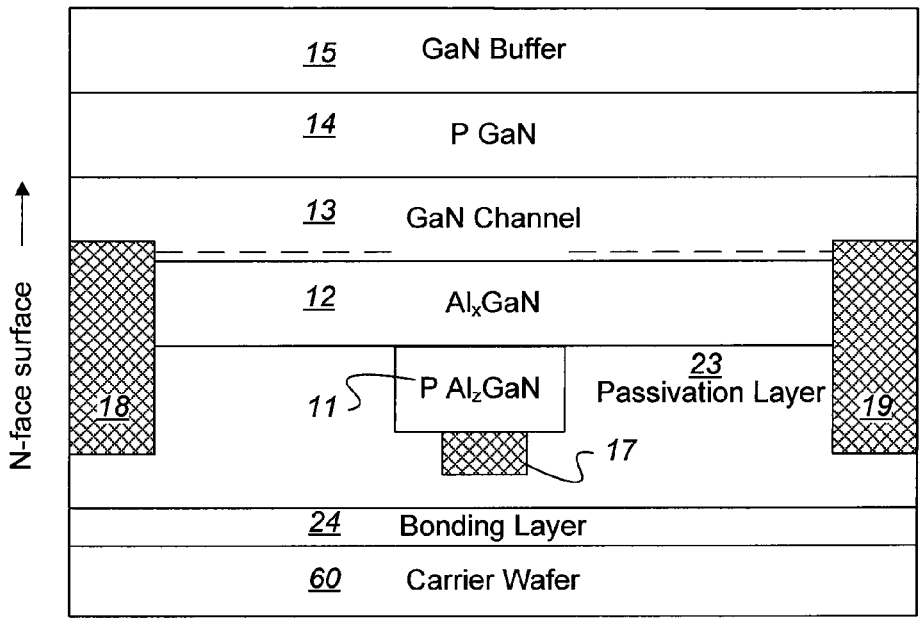
FIG._11
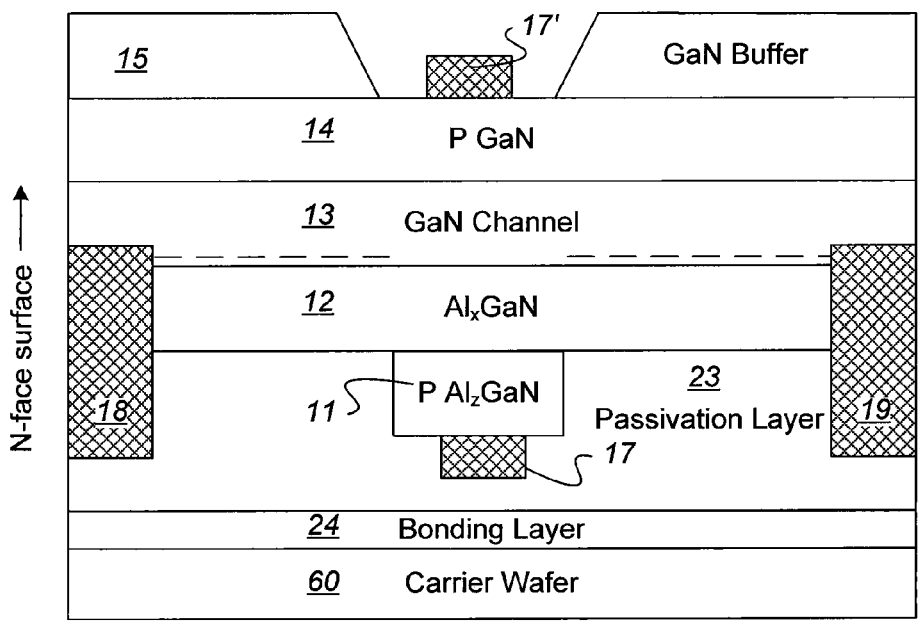
FIG._12

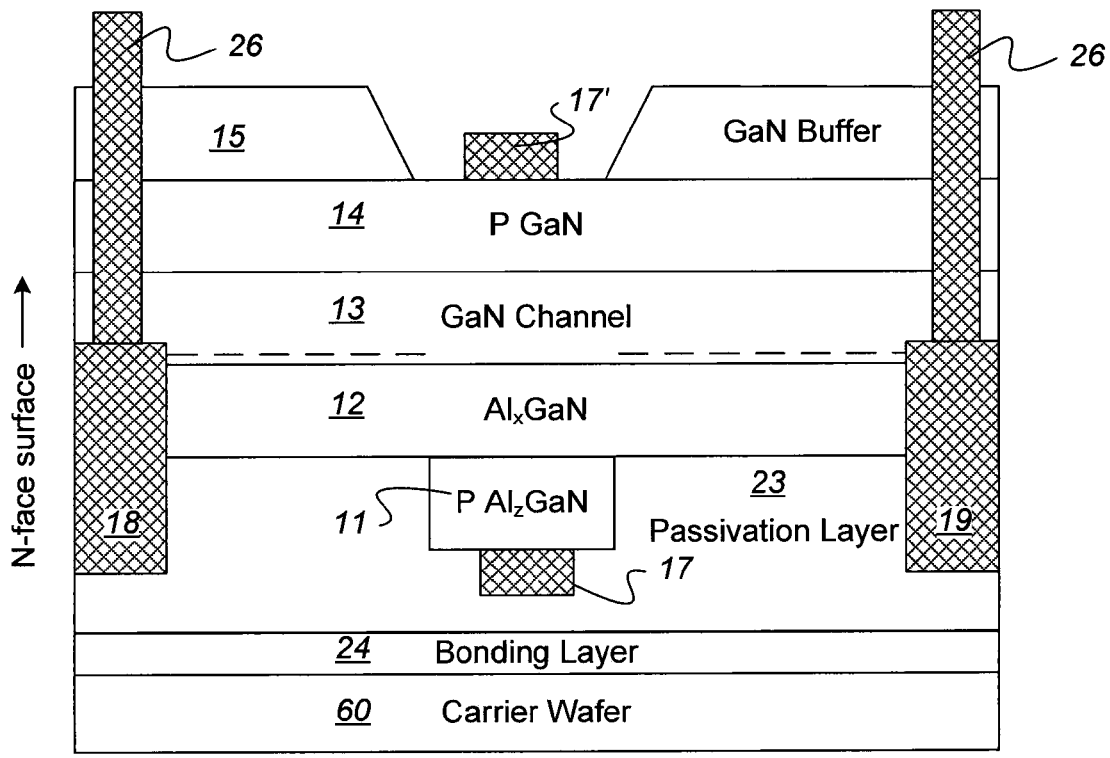
FIG._13
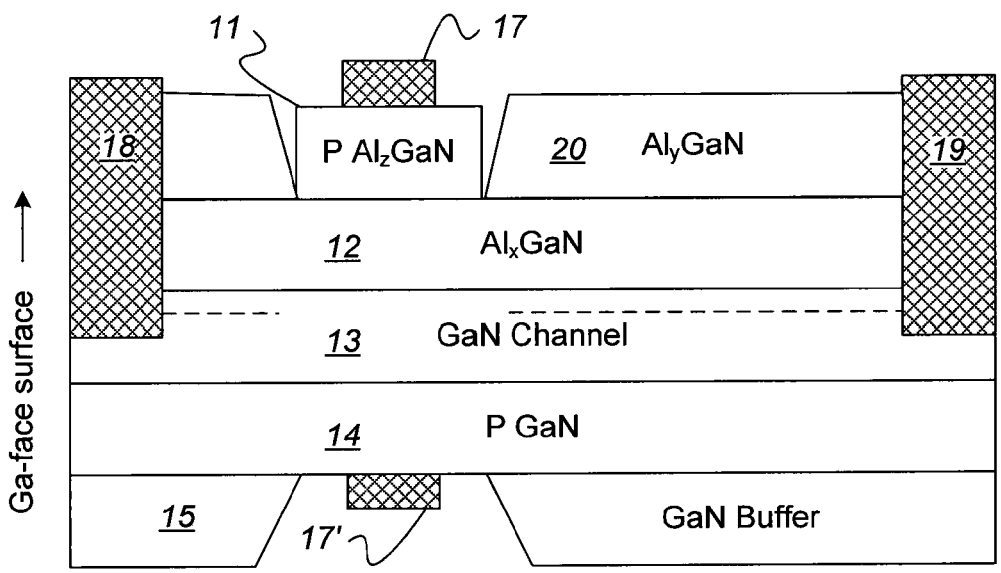
FIG._14

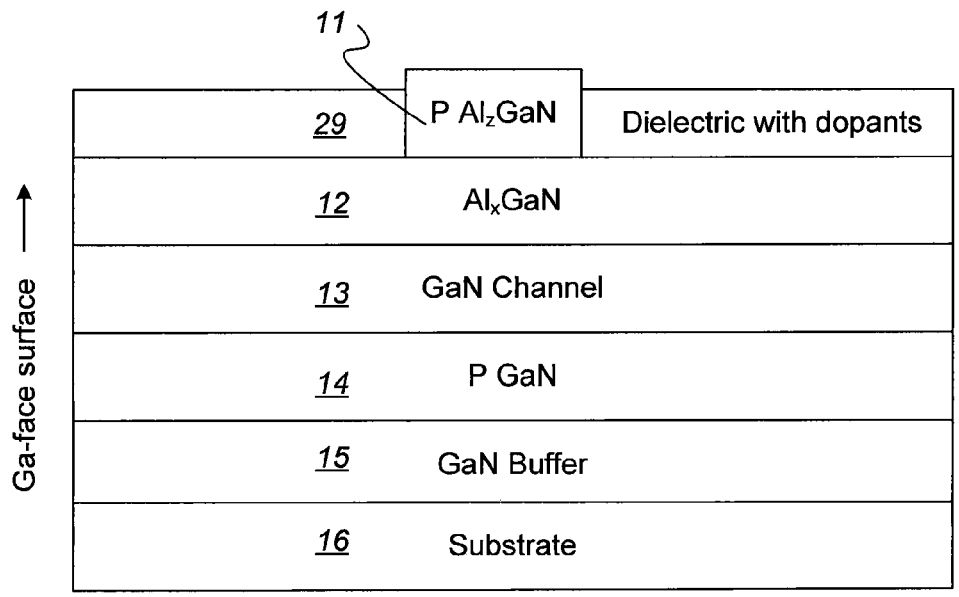
FIG._15
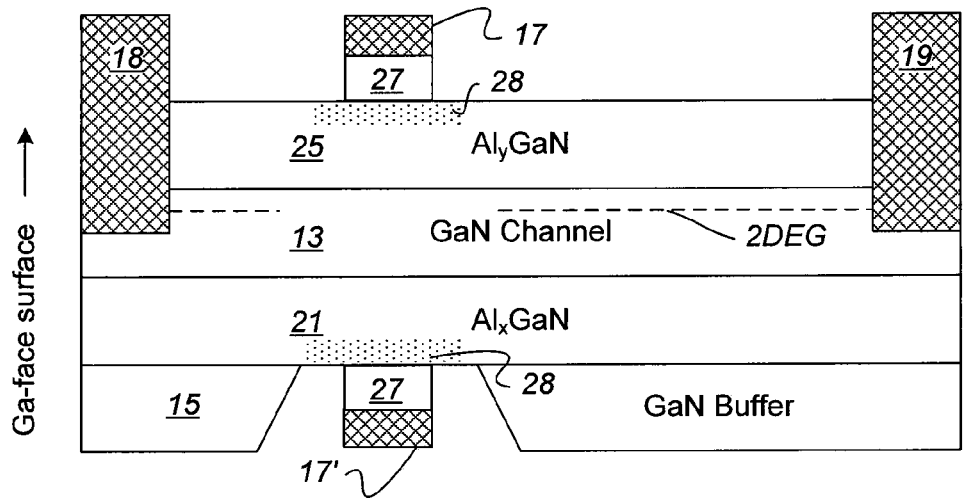
FIG._16

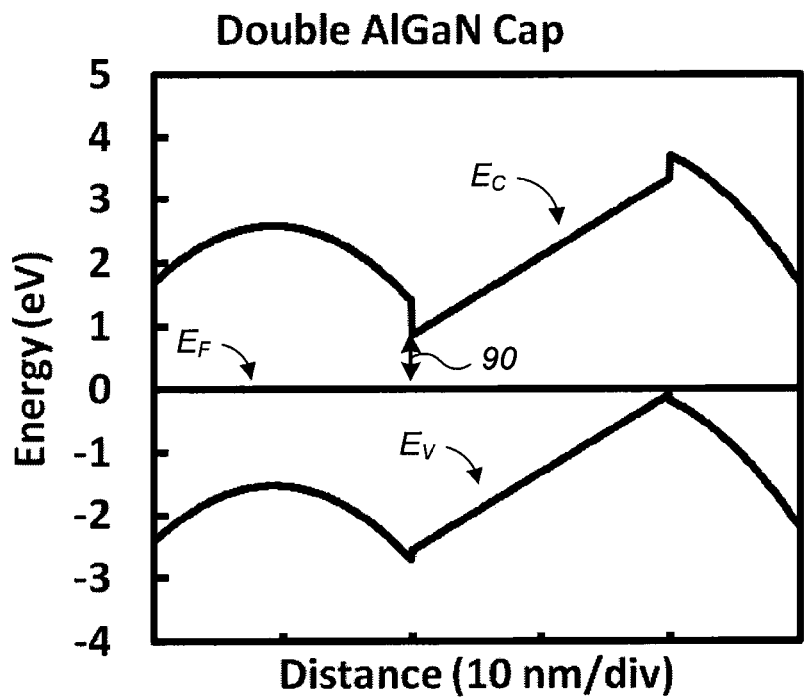
FIG._17
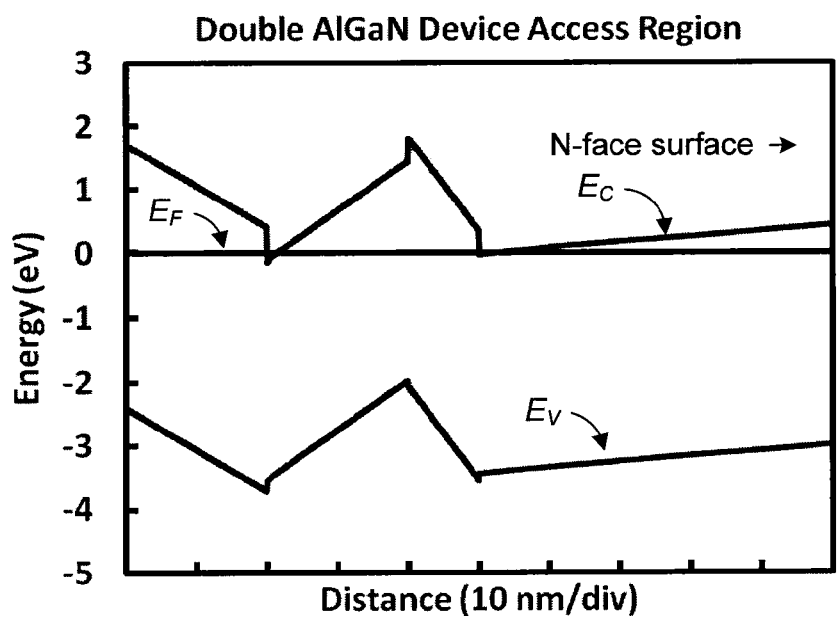
FIG._18

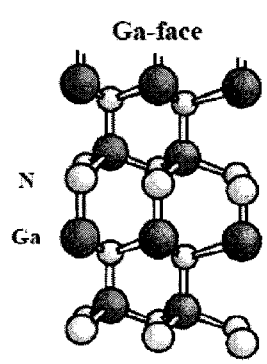
FIG._19
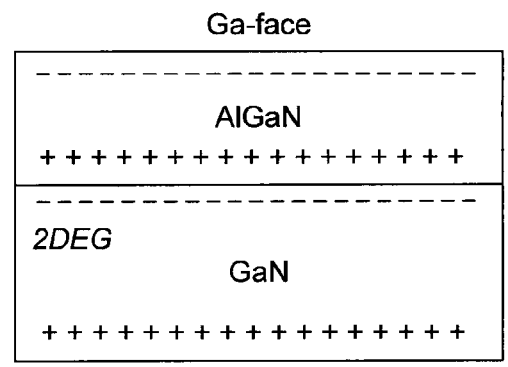
FIG._20
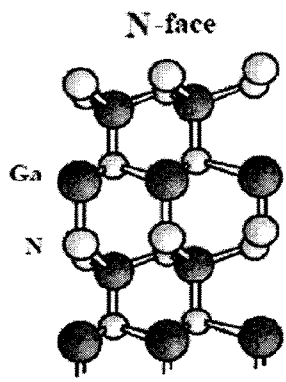
FIG._21
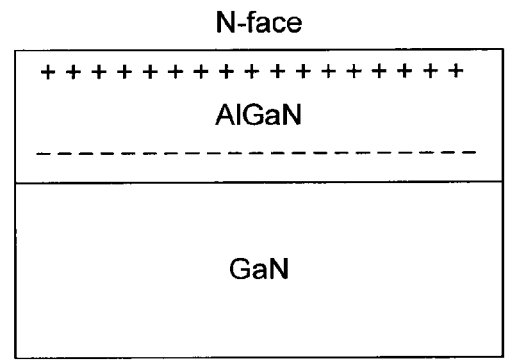
FIG._22
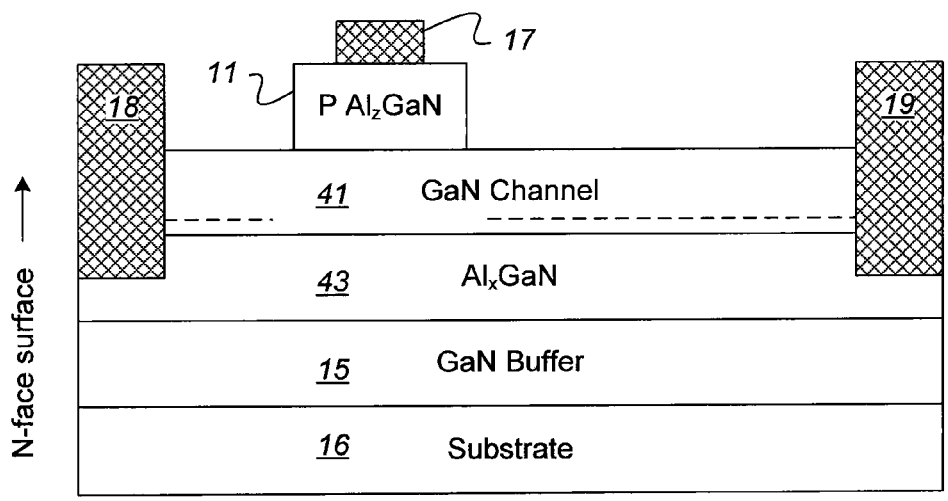
FIG._23

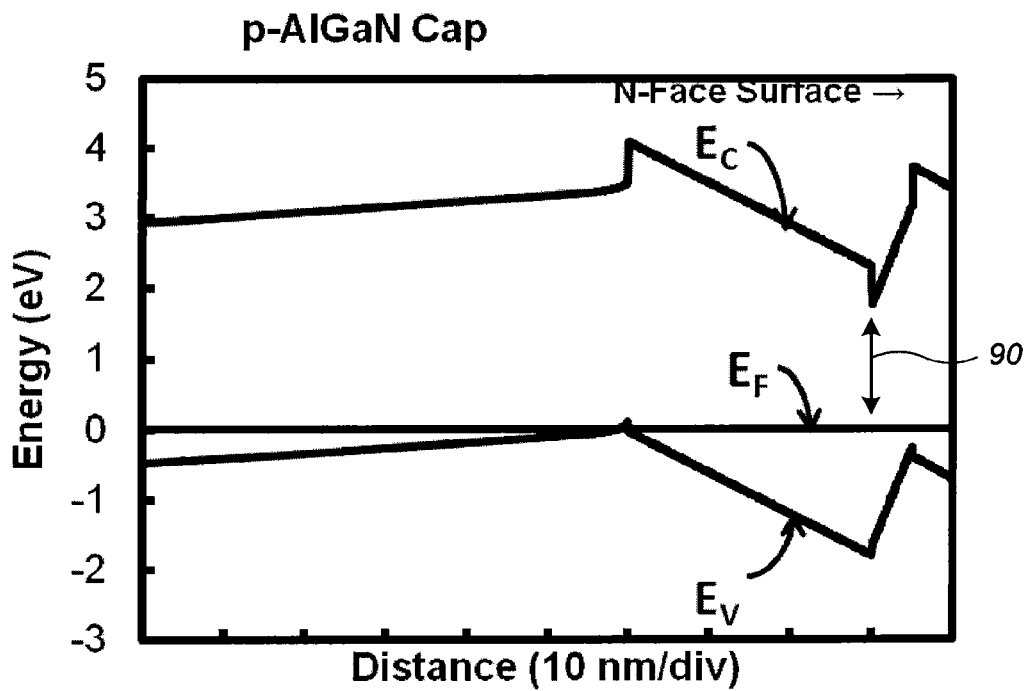
FIG._24
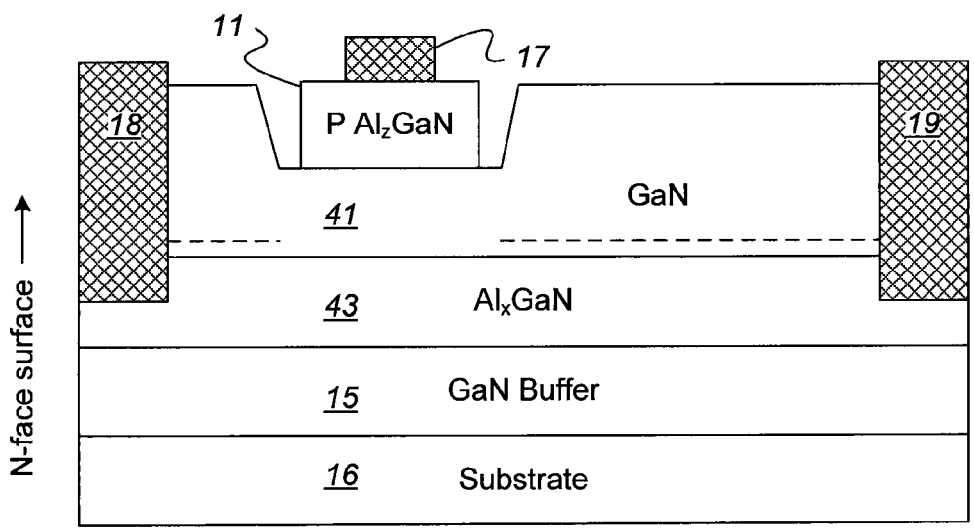
FIG._25 p-GaN Cap Device Access Region
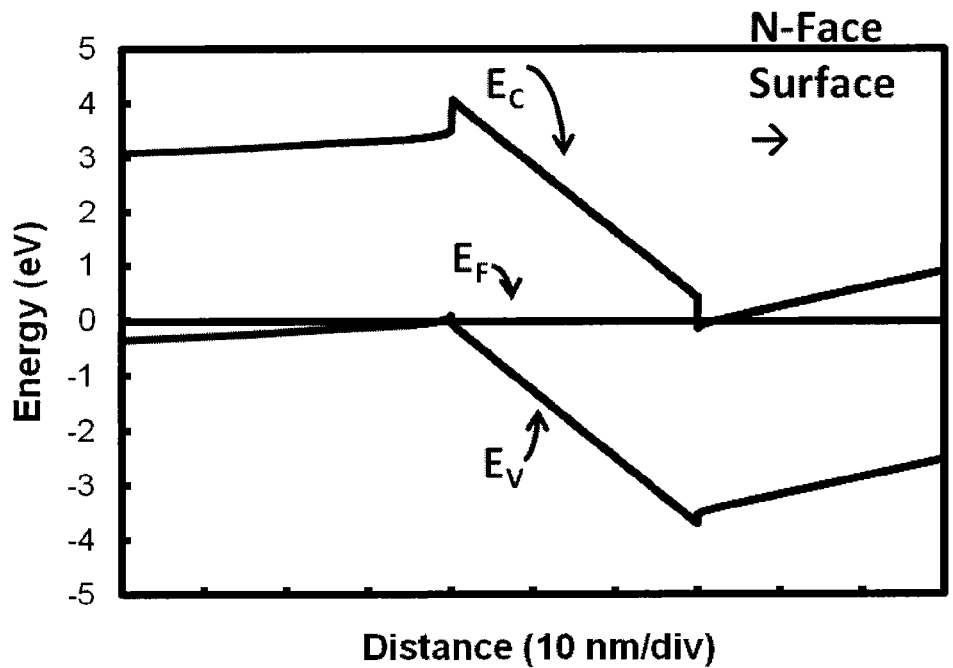
FIG._26
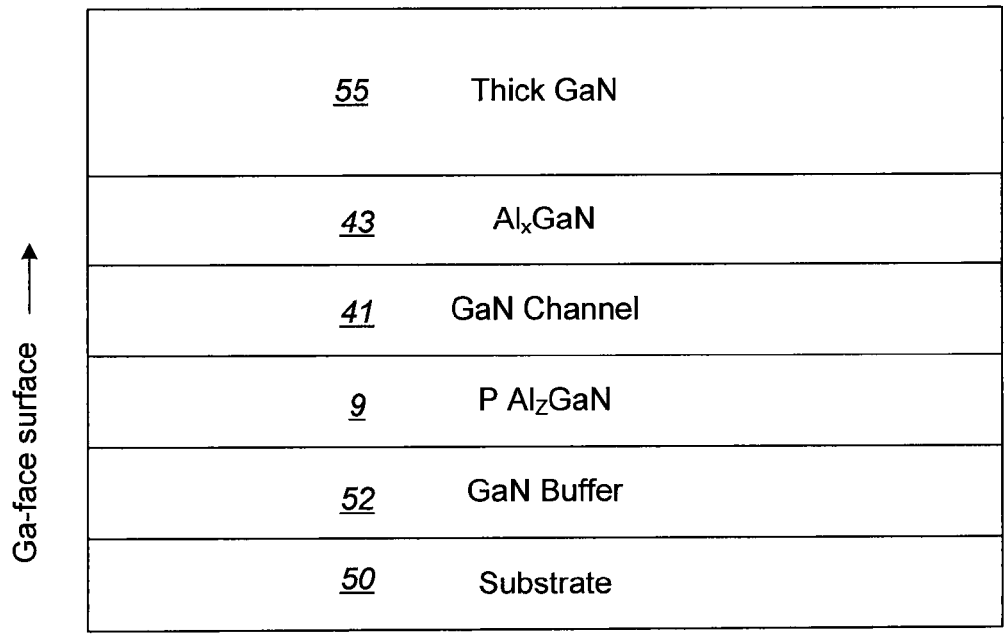
FIG._27

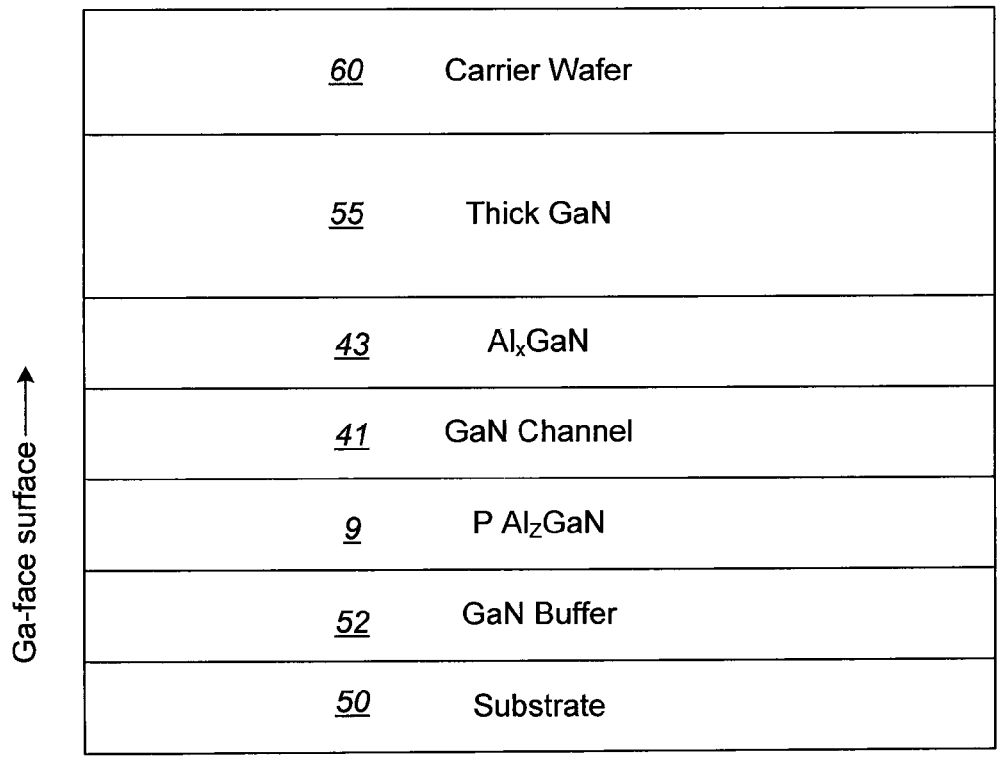
FIG._28
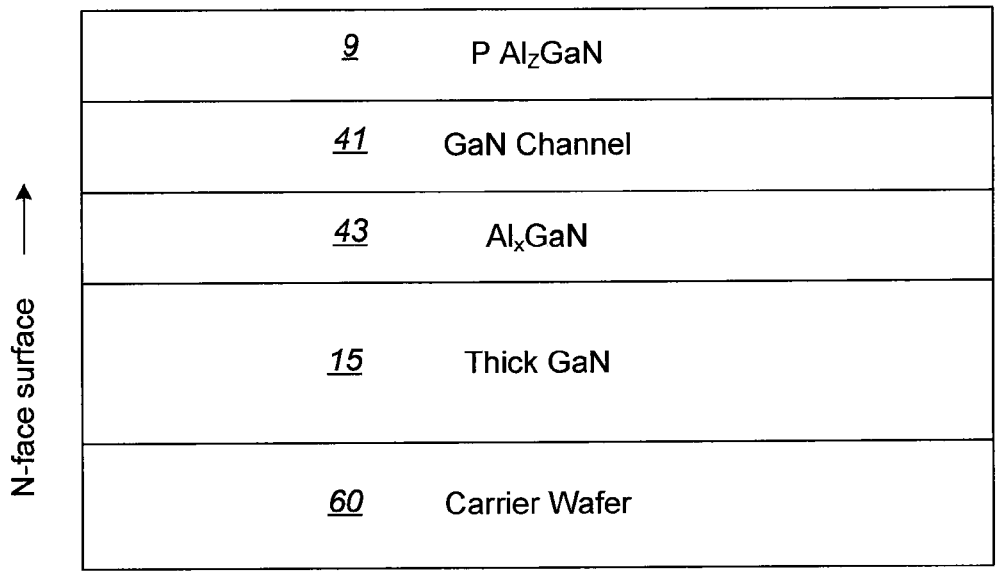
FIG._29

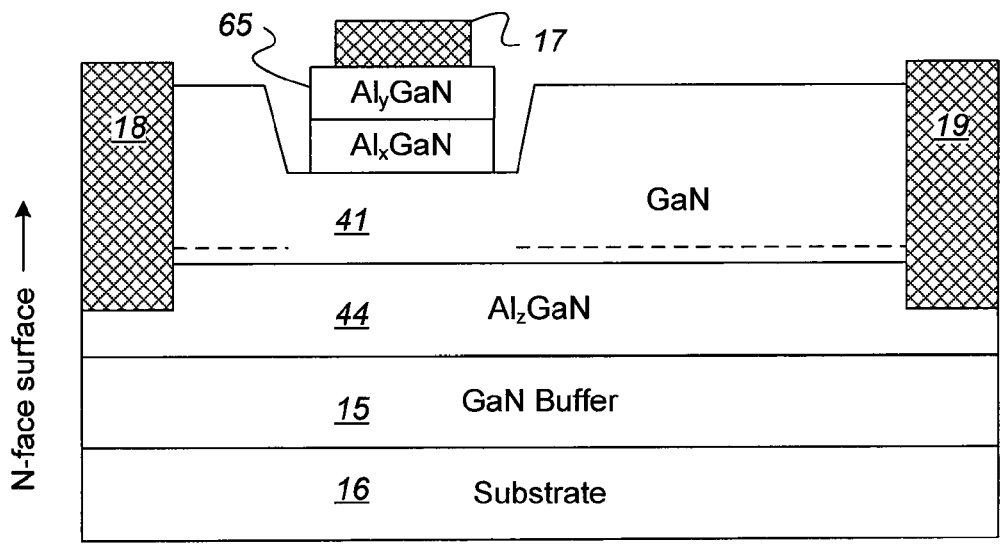
FIG._30
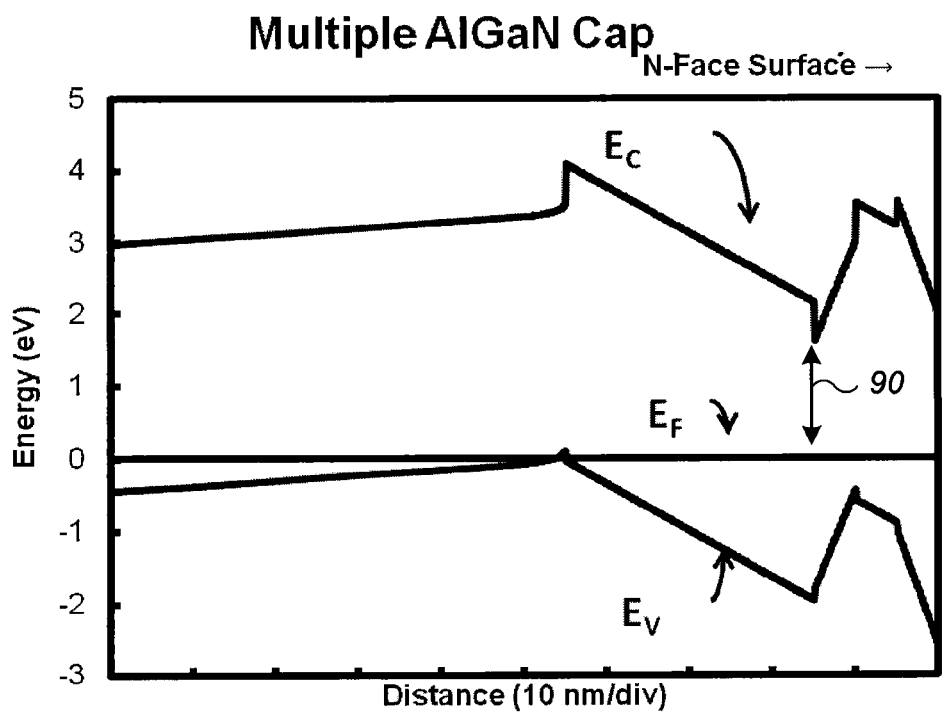
FIG._31

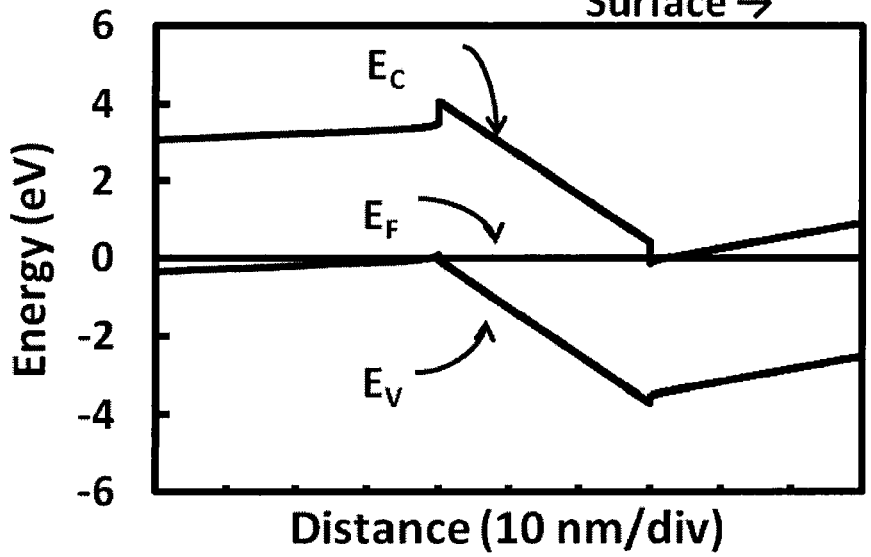
FIG._32
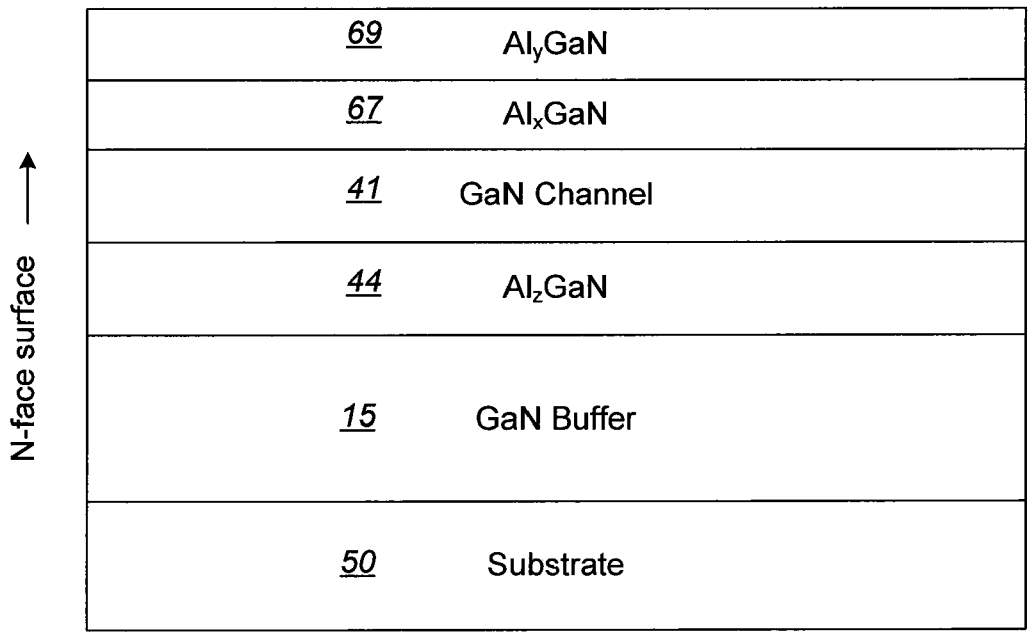
FIG._33

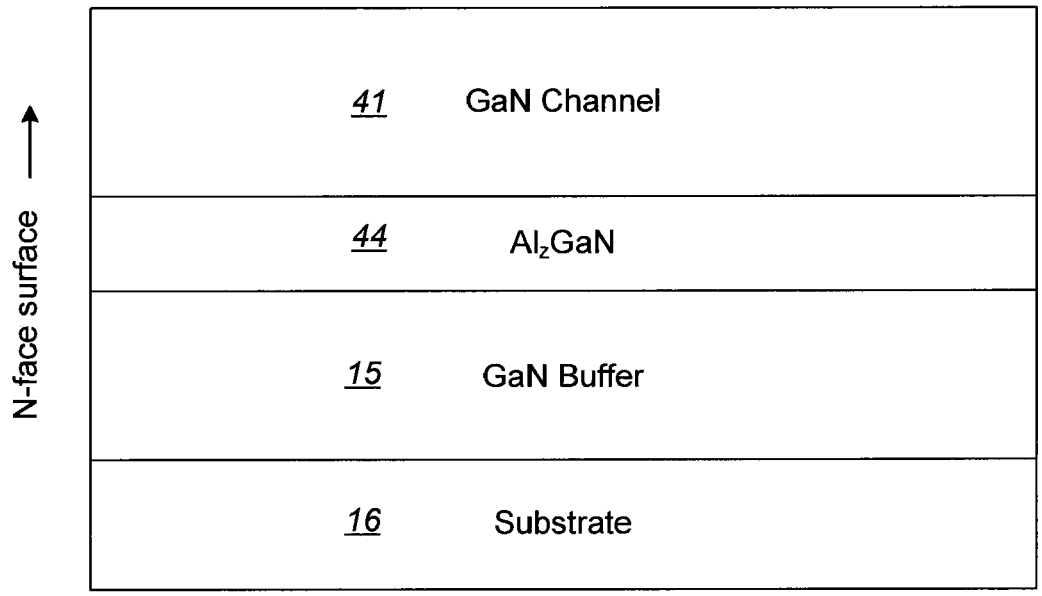
FIG. _34
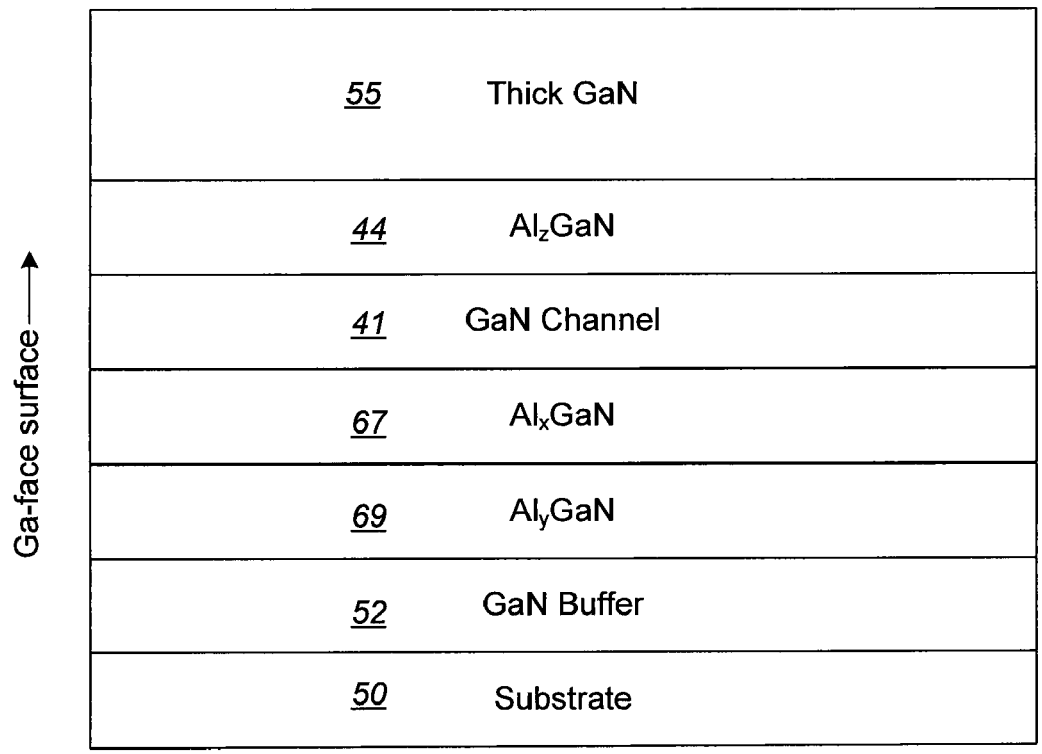
FIG. _35

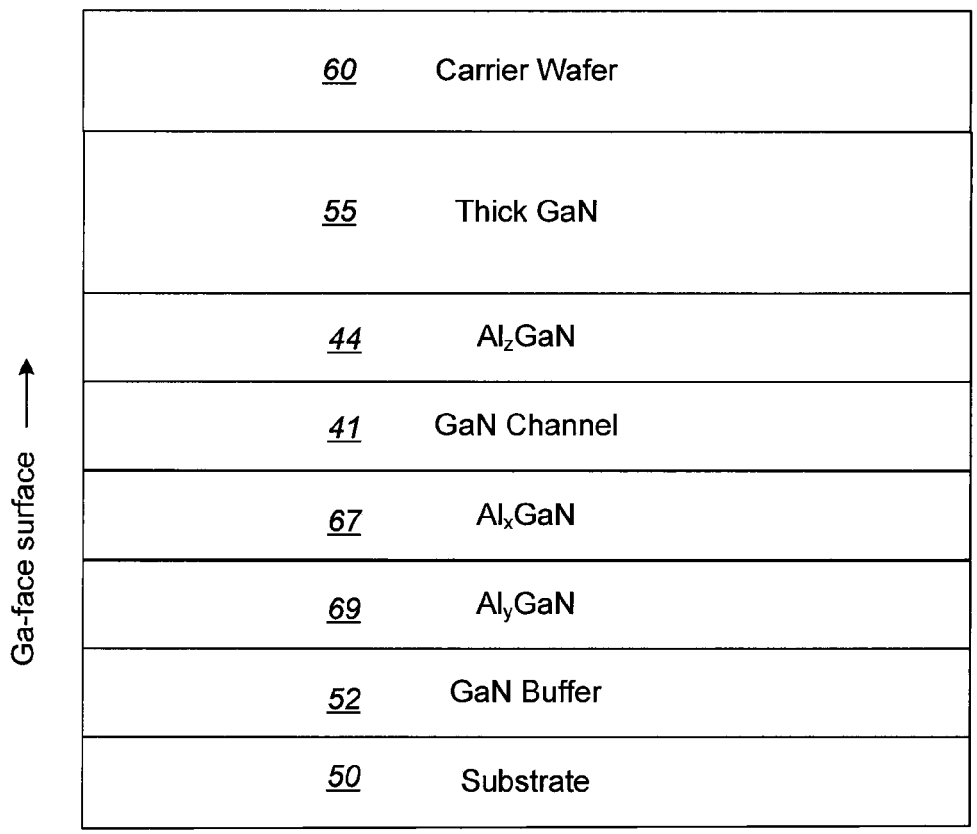
FIG._36
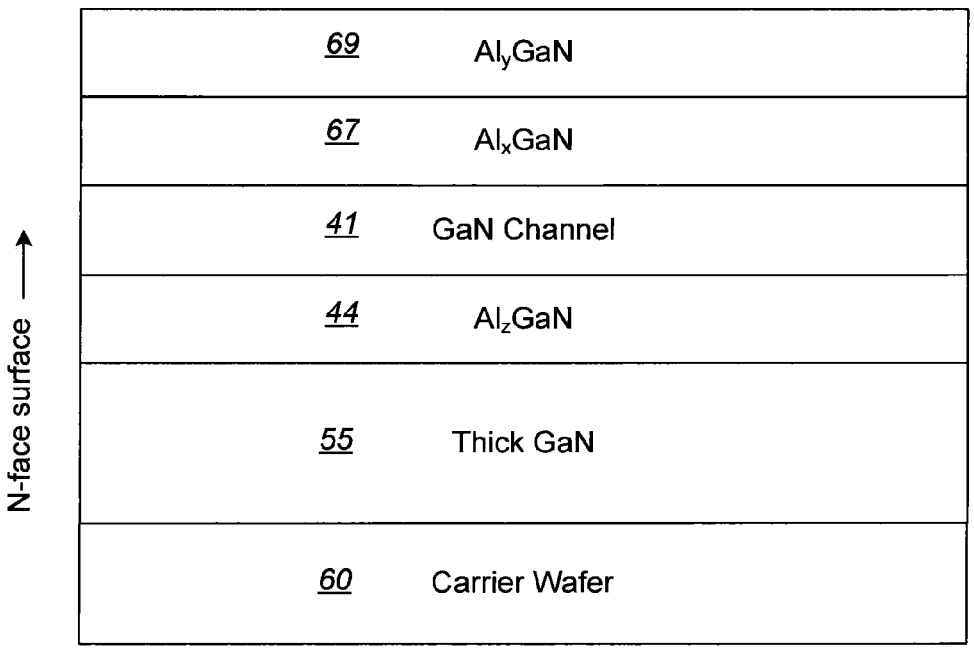
FIG._37

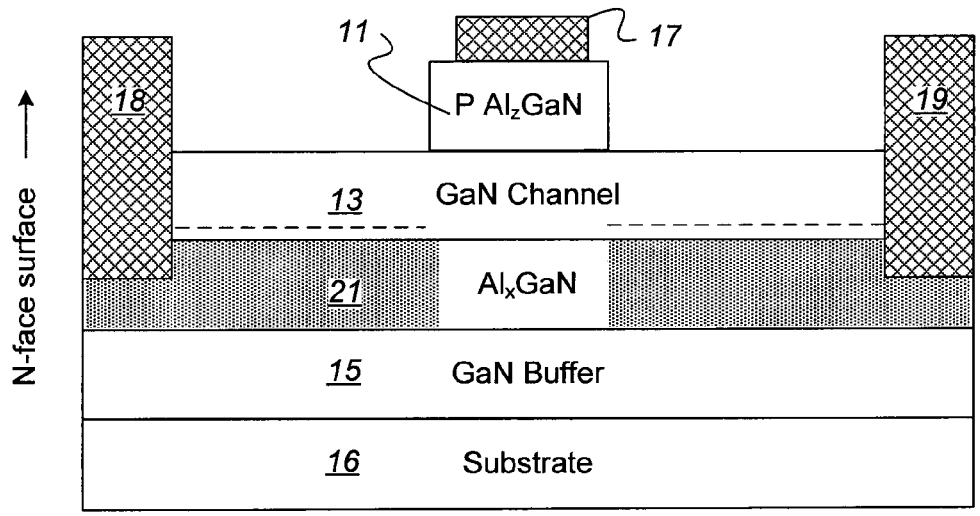
FIG._38
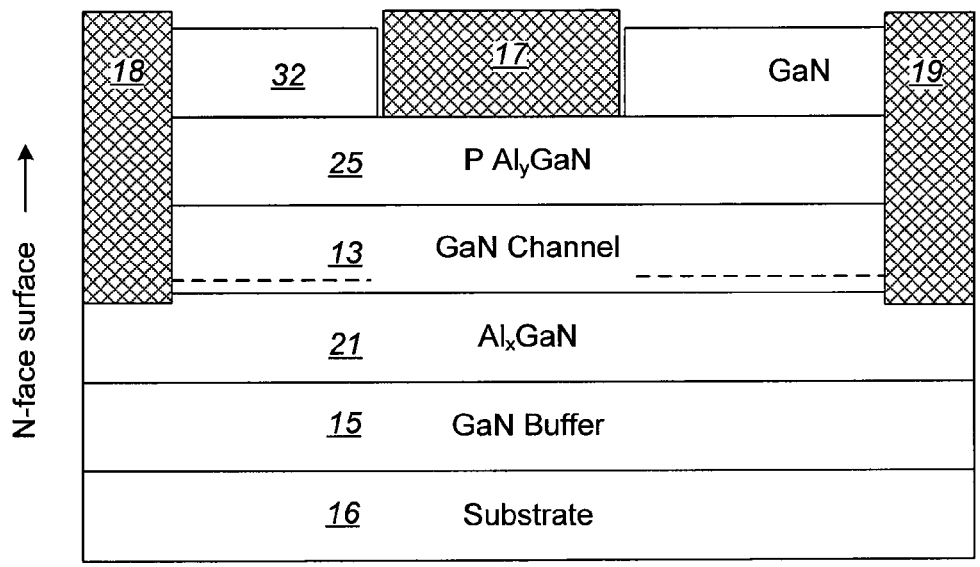
FIG._39

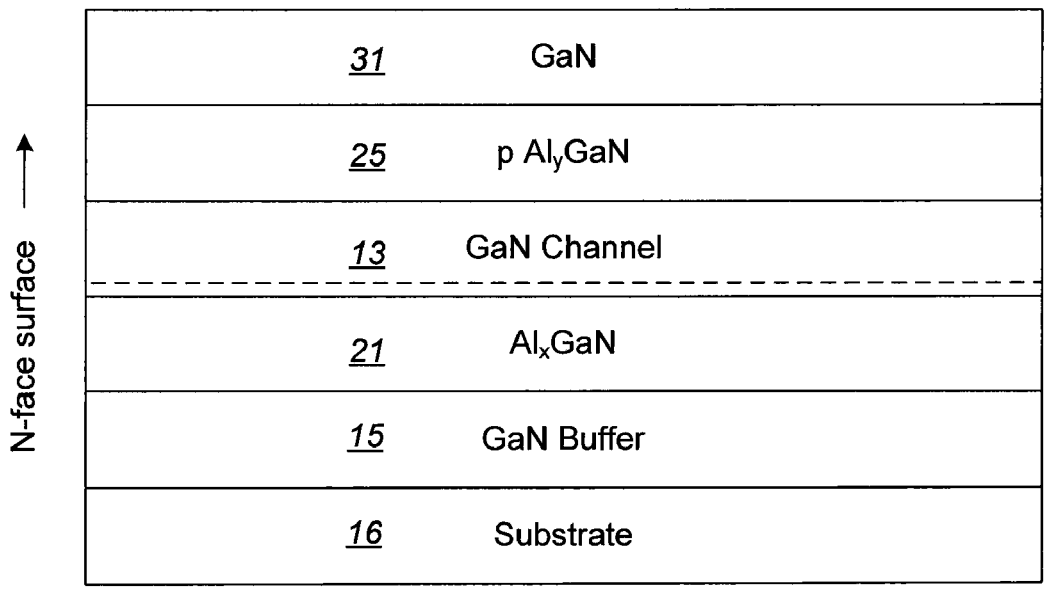
FIG._40
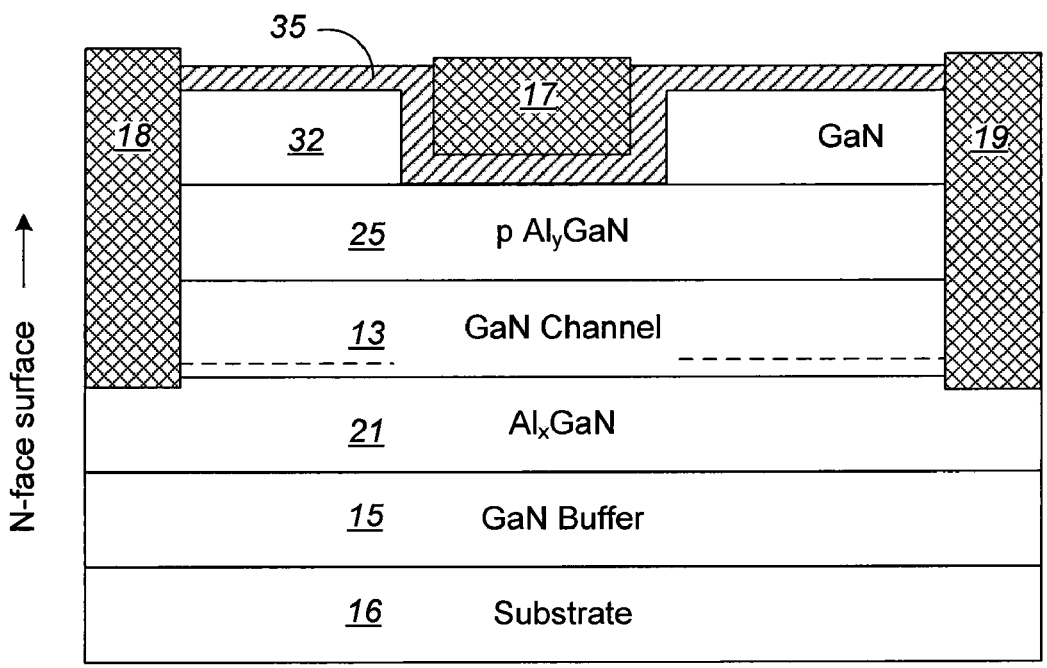
FIG._41

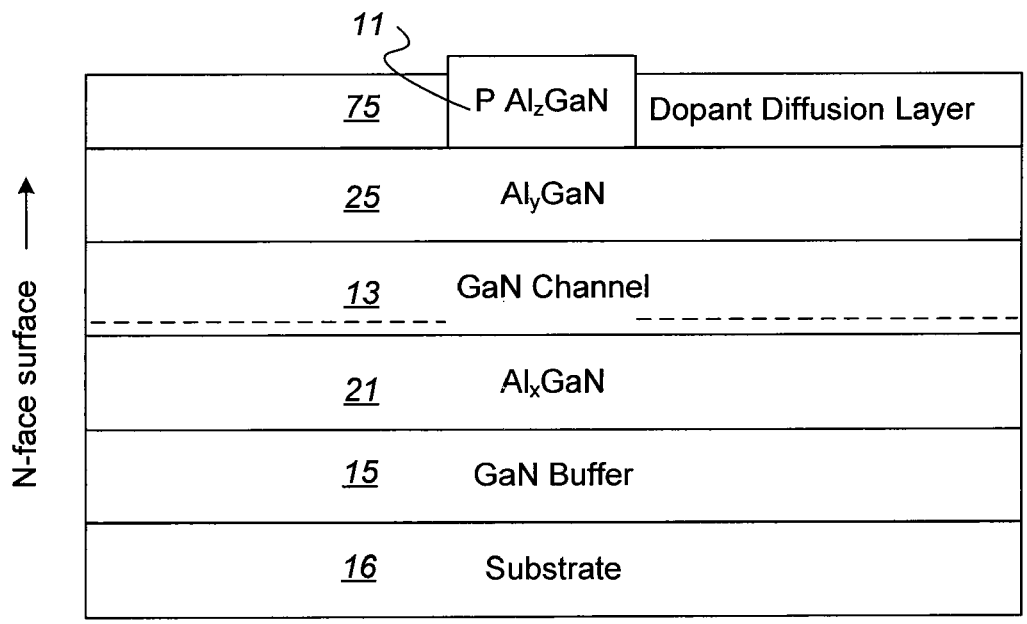
FIG._42
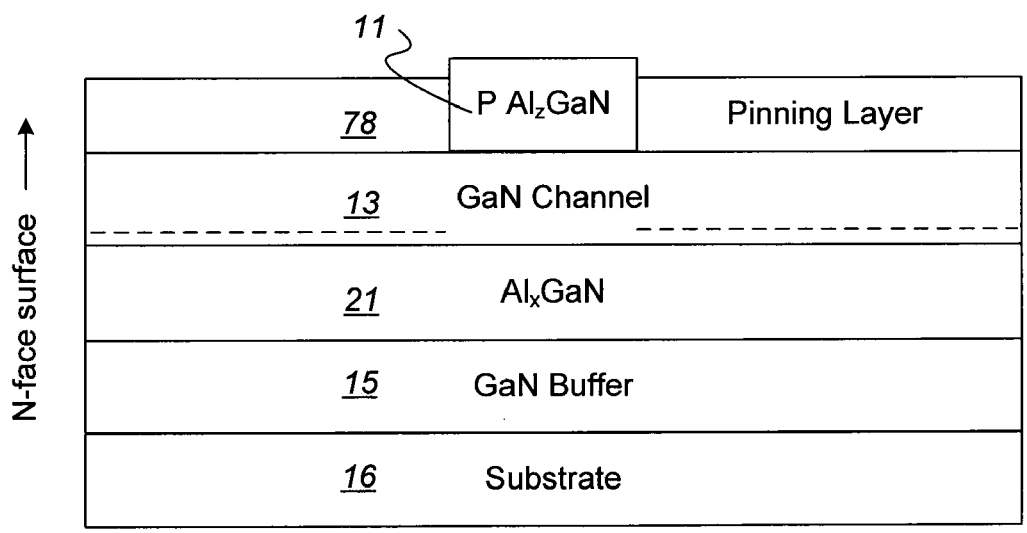
FIG._43

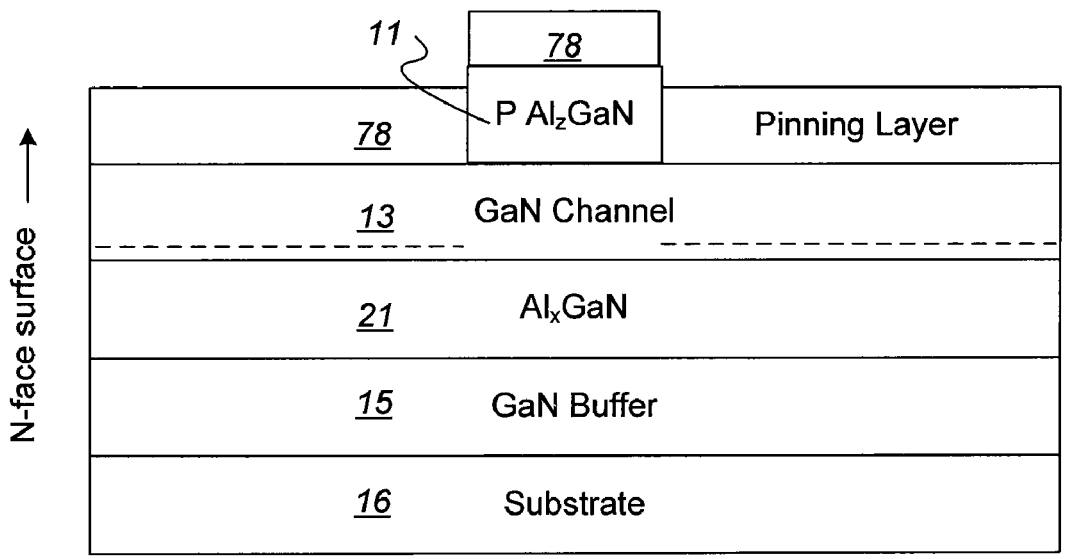
FIG._44
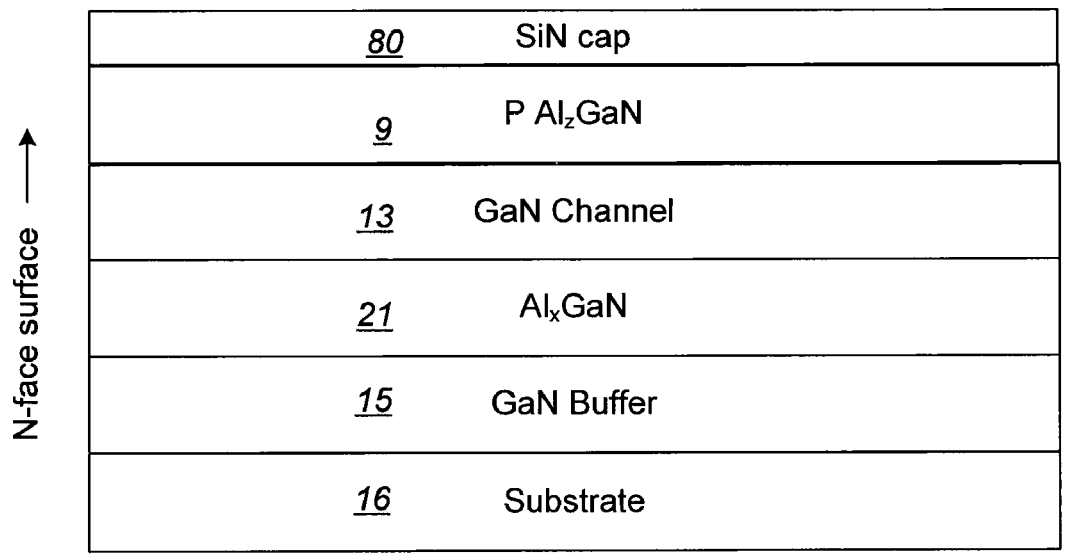
FIG._45

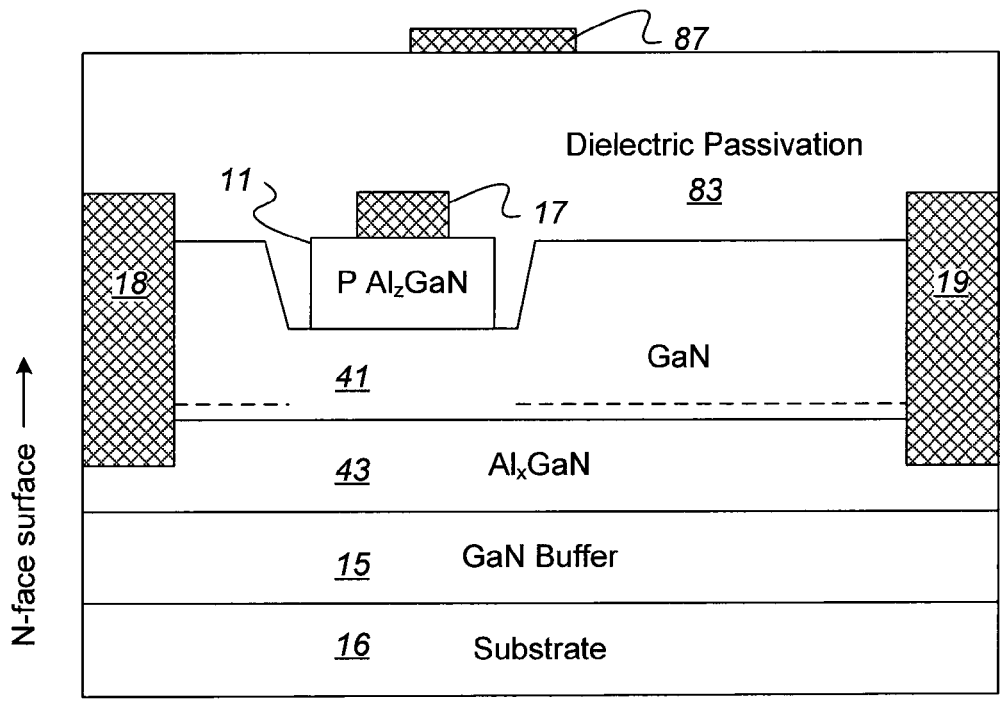
FIG._46
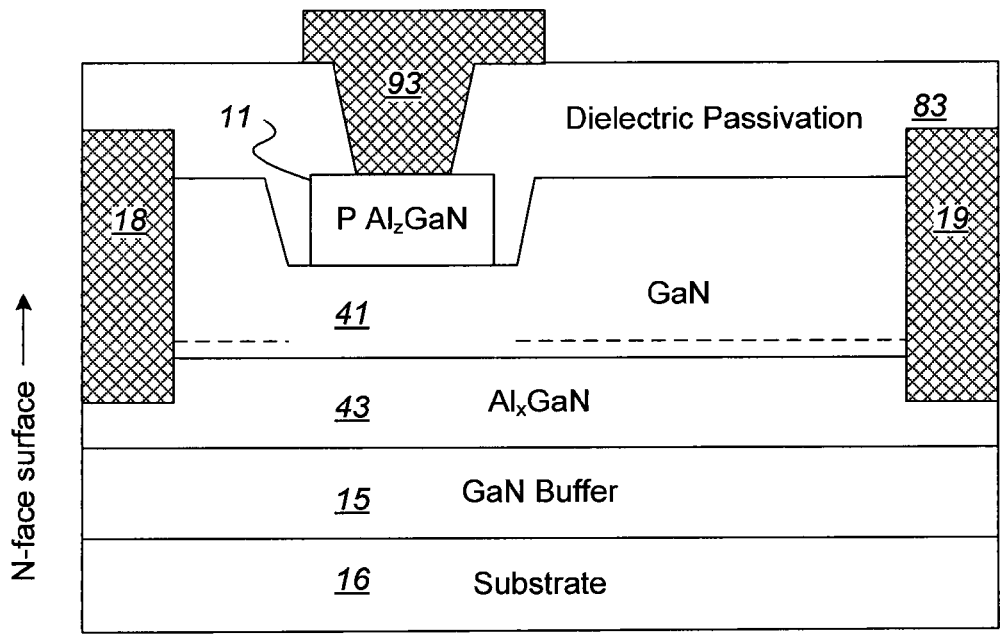
FIG._47

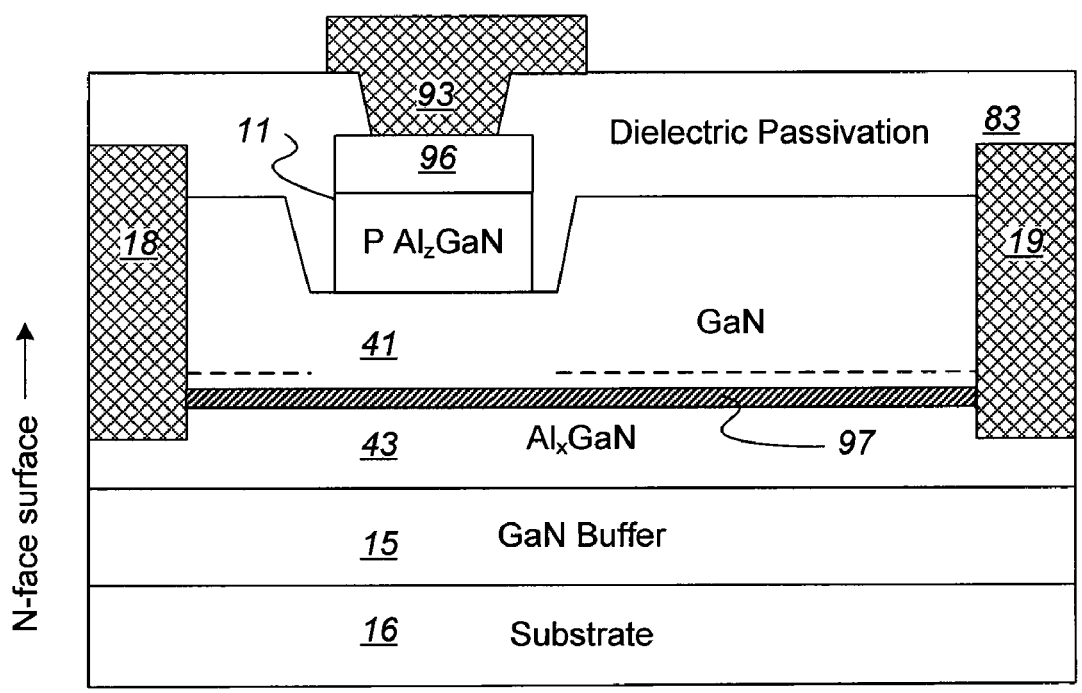
FIG._48

ENHANCEMENT MODE GALLIUM NITRIDE POWER DEVICES

CROSS-REFERENCE TO RELATED APPLICATIONS

This application is a divisional application of U.S. patent application Ser. No. 13/019,150, entitled "Enhancement Mode Gallium Nitride Power Devices," filed on Feb. 1, 2011, which is a divisional application of U.S. patent application Ser. No. 11/856,687, entitled "Enhancement Mode Gallium Nitride Power Devices," filed on Sep. 17, 2007, now U.S. Pat. No. 7,915,643. The entire disclosure of both of the prior applications is hereby incorporated by reference.

BACKGROUND

This disclosure is related to gallium nitride based semiconductor transistors.

Gallium nitride (GaN) semiconductor devices, which are III-V or III-nitride type devices, are emerging as an attractive candidate for power semiconductor devices because the GaN devices are capable of carrying large currents and supporting high voltages. Such devices are also able to provide very low on-resistance and fast switching times. A high electron mobility transistor (HEMT) is one type power semiconductor device that can be fabricated based on GaN materials. As used herein, GaN materials that are suitable for transistors can include secondary, tertiary, or quaternary materials, which are based on varying the amounts of the III type material of AlInGaN, Al, In and Ga, from 0 to 1, or $Al_xIn_yGa_{1-x-y}N$. Further, GaN materials can include various polarities of GaN, such as Ga-polar, N-polar, semi-polar or non-polar. In particular, N-face material may be obtained from N-polar or semi-polar GaN.

A GaN HEMT device can include a III-nitride semiconductor body with at least two III-nitride layers formed thereon. Different materials formed on the body or on a buffer layer causes the layers to have different band gaps. The different materials in the adjacent III-nitride layers also causes polarization, which contributes to a conductive two dimensional electron gas (2DEG) region near the junction of the two layers, specifically in the layer with the narrower band gap. One of the layers through which current is conducted is the channel layer. Herein, the narrower band gap layer in which the current carrying channel, or the 2DEG is located is referred to as the channel layer. The device also includes a gate electrode, a schottky contact and an ohmic source and drain electrodes on either side of the gate. The region between the gate and drain and the gate and source, which allows for current to be conducted through the device, is the access region.

The III-nitride layers that cause polarization typically include a barrier layer of AlGaN adjacent to a layer of GaN to induce the 2DEG, which allows charge to flow through the device. This barrier layer may be doped or undoped. In some cases, doping of the barrier layer may add to channel charge and it may also help in dispersion control. Because of the 2DEG typically existing under the gate at zero gate bias, most III-nitride devices are normally on or depletion mode devices. If the 2DEG is depleted, i.e., removed, below the gate at zero applied gate bias, the device can be an enhancement mode or normally off device.

Enhancement mode or normally off III-nitride type devices are desirable for power devices, because of the added safety they provide. An enhancement mode device requires a positive bias applied at the gate in order to conduct current. Although methods of forming III-nitride enhancement type devices are known, improved methods of depleting the 2DEG from under the gate in the channel layer are desirable.

SUMMARY

Devices are described that are enhancement mode devices with low off state leakage current as well as low on resistance. This is achieved in structures that result in not only depleting the 2DEG from under the gate region, but also have a high barrier to current flow under the gate region in the off state while ensuring that the region outside the gate, i.e., the access region, remains highly conductive.

In one aspect, a method of forming an N-face enhancement mode high electron mobility transistor device is described. The method includes forming on a substrate a Ga-faced sacrificial layer, forming a cap layer on the sacrificial layer, forming a GaN channel layer on the cap layer, forming an $Al_xGaN$ layer on the channel layer, wherein $0 \leq x \leq 1$, forming a buffer layer on the $Al_xGaN$ layer, bonding a carrier wafer on the buffer layer to form a stack, removing the substrate and the sacrificial layer from the stack to form an N-faced assembly of layers and forming a gate, source and drain on the N-faced assembly of layers.

In another aspect, a normally off III-nitride HEMT device is described. The device includes a gate, a source and a drain and an access region formed of a III-nitride material between either the source and the gate or the drain and the gate. In the access region the sheet resistance is less than 750 ohms/square. The device has an internal barrier under the gate of at least 0.5 eV, such as at least 1 eV, when no voltage is applied to the gate. The device is capable of supporting a 2DEG charge density under the gate of greater than $1 \times 10^{12}/cm^2$ in the on state.

In yet another aspect, a Ga-face enhancement mode high electrode mobility transistor device is described. The device includes a GaN buffer layer, a p-type bottom cap on the GaN buffer layer, wherein the GaN buffer layer has an aperture exposing the bottom cap, a GaN channel layer on an opposite side of the bottom cap from the GaN buffer layer, an $Al_xGaN$ layer on an opposite side of the GaN channel layer from the cap layer, a p-type top cap on an opposite side of the $Al_xGaN$ layer from the channel layer and a gate adjacent to the top cap.

In yet another aspect, a method of making a Ga-face enhancement mode high electrode mobility transistor device is described. The method includes forming a structure including the GaN buffer, GaN channel layer and $Al_xGaN$ layer, forming the p-type top cap on the $Al_xGaN$ layer, forming the gate adjacent to the p-type top cap, applying a passivation layer over the p-type top cap and $Al_xGaN$ layer, bonding a carrier wafer onto the passivation layer and forming the aperture in the GaN buffer layer.

In another aspect, a Ga-face enhancement mode high electrode mobility transistor device is described. The device has a GaN buffer layer, an $Al_xGaN$ layer on the GaN buffer layer, wherein the GaN buffer layer has an aperture exposing the $Al_xGaN$ layer, a GaN channel layer on an opposite side of the $Al_xGaN$ layer from the GaN buffer layer, an $Al_yGaN$ layer on an opposite side of the GaN channel layer from the $Al_xGaN$ layer, wherein a gate region of the $Al_yGaN$ layer is treated with fluorine and an upper gate adjacent to the gate region. The fluorine treatment can include a treatment with a fluorine containing plasma.

In yet another aspect, a method of forming a Ga-face enhancement mode high electrode mobility transistor device is described. The method includes forming a structure of the GaN buffer layer, the $Al_xGaN$ layer on the GaN buffer layer, wherein the GaN buffer layer has an aperture exposing a portion of the $Al_xGaN$ layer, a GaN channel layer on an opposite side of the $Al_xGaN$ layer from the GaN buffer layer and an $Al_yGaN$ layer on an opposite side of the GaN channel layer from the $Al_xGaN$ layer, treating the exposed portion of the AlxGaN layer with a fluorine containing compound and treating the gate region of the AlyGaN layer with the fluorine containing compound.

In yet another aspect, a structure that is part of an enhancement mode high electrode mobility transistor device is described. The structure includes a GaN buffer layer on a substrate. On the buffer layer is a heterostructure region and 2DEG formed by a layer of AlGaN, with an aluminum composition between 0 and 1 or equal to 1 and a GaN channel layer. A cap is on the layers that form the heterostructure region. A dielectric layer is formed on the layers that form the heterostructure region and adjacent to the cap. A gate on the cap. The device is an N-face device.

In one aspect, an N-face enhancement mode high electron mobility transistor device is described. The device includes a substrate and a heterostructure region and 2DEG region formed by a layer of AlGaN with an aluminum composition between 0 and 1 or equal to 1 and a GaN channel layer. The heterostructure region is on the substrate. The GaN channel layer has a Ga-face adjacent to the layer of $Al_xGaN$. A cap is in a recess of an N-face of the channel layer. The cap does not overlie an access region of the device. A gate is formed on the cap. A source and drain are on laterally opposing sides of the cap.

Embodiments of the devices and methods described herein may include one or more of the following features. A GaN channel layer on the cap layer can be a channel layer of GaN with up to 15% Al in the GaN. The cap layer can include p-type $Al_zGaN$ and a method of forming a device can further include etching the p-type $Al_zGaN$ to form a p-type $Al_zGaN$ cap, where forming a gate includes forming the gate on the p-type $Al_zGaN$ cap. Forming the channel layer and forming the $Al_xGaN$ layer on the channel layer can form a region of a first 2DEG charge, a method can further include forming a layer surrounding the p-type $Al_zGaN$ cap, the layer surrounding the p-type $Al_zGaN$ cap and the channel layer together having a net 2DEG charge that is greater than the first 2DEG charge. Forming a layer surrounding the p-type $Al_zGaN$ cap can include forming a layer of $Al_yGaN$, wherein y<x. Forming a cap layer of p-type $Al_zGaN$ can include forming the cap layer to have a thickness of at least 50 Angstroms, with $0<z<1$. Forming a channel layer of GaN can comprise forming a channel layer having a thickness less than 300 Angstroms under the gate region. Forming a GaN channel layer can include forming a channel layer having a thickness about 50 Angstroms. A device can have a 2DEG charge that is depleted under the gate and can have an internal barrier that is greater than 0.5 eV, such as at least 1 eV. The channel layer can be $Al_zGaN$, $0.05<z<0.15$. Forming the cap layer can include forming a multi-compositional cap layer, wherein a first layer of the cap layer comprises $Al_xGaN$ and a second layer of the cap layer comprises of $Al_yGaN$, wherein the second layer is formed prior to the first layer being formed and y>x. A method of forming a device can include etching the multi-compositional cap layer to form a multi-compositional cap and forming a layer of GaN surrounding the multi-compositional cap. The surrounding GaN layer can be formed using selective regrowth. The multi-compositional cap layer can change from $Al_xGaN$ to $Al_yGaN$ in a continuous or discontinuous manner.

The carrier layer can be thermally conducting and electrically insulating. Removing the substrate can include using laser liftoff, lapping, wet etching or dry etching. The method can further include plasma treating a portion of an N-face that corresponds to a location in which the gate is subsequently formed. The channel layer and the layer of $Al_xGaN$ can form a hetero structure with a resulting 2DEG region in the channel layer and the method can further include implanting ions in the access region of the wider bandgap layer to increase net 2DEG charge. The device can have an access region, and the method can further include doping the access region by thermal diffusion of donor species. An N-face layer can be passivated after the N-face layer is exposed. In a device where the structure is built upside down, an AlN layer can be formed on the channel layer prior to forming the layer of $Al_xGaN$. The access region can be selectively doped in the channel layer, such as by thermal diffusion of donor species. A dielectric layer can be formed on a surface of the access region to form a pinning layer. The device can be capable of blocking at least 600 V, 900V or 1200 V. The device can have an on-resistance of less than 15 mohm-$cm^2$, less than 10 mohm-$cm^2$, 3 mohm-$cm^2$ or less than 2 mohm-$cm^2$. A top cap can be formed of p-type $Al_zGaN$. The top cap may comprise a thin AlN layer, e.g., less than 20 Angstroms, or a high Al composition AlGaN layer, e.g., where the Al composition is greater than 50%, to prevent or reduce gate leakage. A bottom cap can be formed of p-type GaN. The bottom cap can be formed of $Al_yGaN$, wherein y varies from one surface to an opposite surface of the bottom cap. The $Al_xGaN$ layer can have a thickness of less than 500 Angstroms. The channel layer can have a thickness of less than 300 Angstroms, such as less than 100 Angstroms, under the gate region. A gate can be in an aperture and contacting the bottom cap. A layer of $Al_yGaN$ can laterally surround the top cap, where y>x. The device can have an internal barrier of at least 0.5 eV, such as at least 1 eV when no voltage is applied to the gate. A gate can be formed in the aperture in the GaN buffer layer. The $Al_xGaN$ layer exposed by an aperture can be doped with fluorine. A lower gate can be within an aperture exposing the $Al_xGaN$ layer. A p-type cap layer can be between the upper gate and the $Al_yGaN$ layer. A p-type cap layer can be between the lower gate and the $Al_xGaN$ layer. An insulator layer can be between the lower gate and the $Al_xGaN$ layer. An insulator layer can be between the upper gate and the $Al_yGaN$ layer. The device can have an internal barrier of at least 0.5 eV, such as at least 1 eV, when no voltage is applied to the gate. An insulator can be between the upper gate and the gate region. A cap can be a p-type cap. The cap can be a combination of p-type AlGaN layer and an AlN layer. The cap can include $Al_yGaN$ and $Al_xGaN$, the $Al_yGaN$ is closer to the gate than the $Al_xGaN$ is and y>x. The $Al_yGaN$ and $Al_xGaN$ can be doped p-type. The channel layer can be adjacent to the cap. The dielectric layer can be a dopant diffusion layer and donor species in the dopant diffusion layer can increase 2DEG density in the access region. The dielectric layer can be on a side of the cap opposite to the channel layer. The channel layer can be adjacent to the cap and can have an N-face adjacent to the cap. The dielectric layer can form a pinning layer and can induce charge in the access region. A layer of AlN can be between the layer of AlGaN forming the heterostructure and the 2DEG and the GaN channel layer. A slant field plate can be on the gate. The dielectric layer can be between the cap layer and the gate. The GaN channel layer can laterally surround a gate region in which the gate is located. The cap can be a p-type $Al_zGaN$. The cap can include p-type $Al_zGaN$ and AlN layers. The cap can include $Al_yGaN$ and $Al_xGaN$, where the $Al_yGaN$ is closer to the gate than the $Al_xGaN$ is and y>x. The $Al_yGaN$ and $Al_xGaN$ can be doped p-type. The cap can include $Al_yGaN$ and $Al_xGaN$, where the $Al_yGaN$ is closer to the gate than the $Al_xGaN$ is, $Al_yGaN$ and $Al_xGaN$ are doped p-type and x>y. An access region between the gate and source and between the gate and drain can be ion implanted. An insulating layer can be disposed between the gate and the cap. A dielectric passivation layer can be over at least the access region.

Implementations of the methods and devices described herein can include one or more of the following advantages. High performance normally off devices with high positive threshold voltage are achieved. The positive threshold voltage can be adjusted by depositing an insulator of varying thickness on a device. However, high performance normally off devices require a large internal barrier that is not easily adjusted by merely depositing a thick insulator. A device can be formed with a high barrier, which determines the off state leakage current when the device is off. The internal barrier under the gate can be greater than 1 eV. The device may have a threshold voltage that is between about 1-3 volts. A device with a high internal barrier under the gate region can be formed while ensuring adequate charge or 2DEG in the access regions. The characteristics of the gate and access region can be independently controlled. Thus, a high internal barrier, high threshold voltage and low access region-resistance (high access region conductance) can simultaneously be achieved.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 1 is a schematic representation of a double p-type capped device.

FIG. 2 is a band diagram under the gate region of the double p-type capped device.

FIG. 3 is a band diagram in the access region of the double p-type capped device.

FIGS. 4-13 show intermediary structures created while forming the double p-type capped device.

FIG. 14 is a schematic representation a device with a regrown AlGaN layer surrounding a p-type cap.

FIG. 15 is a schematic representation a device with a dopant inducing layer in the access region.

FIG. 16 is a schematic representation of a device treated with a fluorine based plasma on both the Ga-face and the N-face.

FIG. 17 is a band diagram under the gate region of the fluorine treated device.

FIG. 18 is a band diagram in the access region of the fluorine treated device.

FIG. 19 is a GaN crystal structure with a Ga-face.

FIG. 20 is a schematic representation of a III-nitride type heterostructure of a Ga-face device.

FIG. 21 is a GaN crystal structure with an N-face.

FIG. 22 is a schematic representation of a III-nitride type heterostructure of an N-face device.

FIG. 23 is a schematic representation of an N-face device with a p-type cap under the gate.

FIG. 24 is a band diagram under the gate region of the N-face device with a p-type cap under the gate.

FIG. 25 is a schematic representation of a device with a layer of varying thickness in the access region.

FIG. 26 is a band diagram in the access region of the N-face device with a p-type cap under the gate.

FIGS. 27-29 show an exemplary method of forming an N-face enhancement mode device with a p-type cap.

FIG. 30 is a schematic representation of a device with a multi-compositional cap.

FIG. 31 is a band diagram under the gate region of the device with a multi-compositional cap.

FIG. 32 is a band diagram in the access region of the device with a multi-compositional cap.

FIGS. 33-37 show an exemplary method of forming the enhancement mode N-face device with the multi-compositional cap.

FIG. 38 is a schematic representation of a device that has been ion implanted in the access region.

FIGS. 39-41 illustrate p-type cap devices and structures.

FIG. 42 is a schematic representation of a device with a layer for selectively doping the access region.

FIGS. 43-44 are schematic representations of a device with a Fermi pinning layer.

FIG. 45 is a schematic representation of a device with a dielectric cap.

FIG. 46 is a schematic representation of a device with a dielectric passivation layer on the N-face.

FIG. 47 is a schematic representation of a device with a slant field plate.

FIG. 48 is a schematic representation of a device with a layer of AlN between the layers of the heterojunction.

Like reference symbols in the various drawings indicate like elements.

DETAILED DESCRIPTION

Ga-Faced Devices

Referring to FIG. 1, a Ga-face enhancement mode III-nitride device is formed as a lateral device having a gate 17, source 18 and drain 19, the lateral device formed on a Ga-face surface of the III-nitride device and gating on both the Ga and N-faces of the device. In some embodiments, the Ga-face is a Ga-polar face. The device includes a p-type $Al_zGaN$ cap 11 on the Ga-face and a p-type $Al_yGaN$ cap layer (shown as p GaN layer 14) accessed from the N-face of the device, where 0<y<1 and 0<z<1. In some embodiments, the p-type $Al_zGaN$ cap 11 has a thickness of between about 1 nm and 100 nm, such as about 10 nm. In some embodiments, the p-type $Al_yGaN$ cap layer has a thickness of between about 1 nm and 30 nm, such as about 10 nm. In some embodiments, either of the p-type $Al_zGaN$ cap 11 or the p-type $Al_yGaN$ cap layer is a continuously graded layer, that is, includes more or less aluminum at different depths of the layer. The device includes a GaN layer 15 on the N-face of the p GaN layer 14. The GaN layer 15 includes a recess which exposes the p GaN layer 14 and can have a thickness of between about 10 nm and 500 nm, such as about 50 nm.

On an opposite side of the p GaN layer 14 is a GaN channel layer 13, which can have a thickness of between about 1 nm and 50 nm, such as about 10 nm. A layer of $Al_xGaN$ 12 adjacent to the GaN channel layer 13 and opposite to the p-type GaN cap layer 14 contributes to the 2DEG in the GaN channel layer 13. The p-type $Al_zGaN$ cap 11 is on the layer of $Al_xGaN$ 12, in the gate region and under gate 17. The break in the 2DEG indicator line under the gate, shows that there is no charge under the gate at zero bias on the gate and that the device is an enhancement mode or normally off device. (A dashed line in each figure, other than FIGS. 20 and 22, indicates the 2DEG.) Each of the III-nitride layers can be epitaxially grown on one another.

In some embodiments, the $Al_xGaN/GaN$ layers 12, 13 are grown thin enough so that the surface pinning position of the p-type $Al_zGaN$ or GaN layers 11, 14 depletes the 2DEG at the $Al_xGaN/GaN$ layer interface in the gate region. For example, the $Al_xGaN/GaN$ layers 12, 13 are grown thin when the device includes a fully depleted p-type layer. If the device has a thick p-type layer on top, the barrier created by the p-type $Al_zGaN/Al_xGaN$ junction depletes the 2DEG. Depleting the 2DEG from both surfaces increases the internal barrier and the threshold voltage. The presence of high p-$Al_xGaN$ or GaN barriers also results in high gate turn-on voltage and reduction of gate leakage current. Additional insulating layers may be applied between the gates (17 or 17') and the respective p-type layers (11 and 14).

In some embodiments, one of gates 17, 17' is optional on the device.

Without the p-type $Al_zGaN$ cap 11, the polarization fields in the $Al_xGaN/GaN$ layers 12, 13 allows for the 2DEG at the $Al_xGaN/GaN$ interface in the access region. Thus, the thickness of the $Al_xGaN$ cap 12 is controlled to maintain adequate 2DEG and a low on-resistance.

Referring to FIGS. 2-3, the band diagrams of the double p-type cap device under the gate and the access region, respectively, show the conduction band ($E_C$) and valence band ($E_V$) with respect to the Fermi level ($E_F$). In the band diagram, the minimum distance 90 between the conduction band $E_C$ and the Fermi level $E_F$ at zero bias on the gate defines the device's internal barrier. The internal barrier of the device is about 1 eV. Referring to FIG. 3, the conduction band $E_c$ crosses the Fermi level $E_F$ in the access region of the device, indicating that the device has a high 2DEG density in the access region and hence can achieve a low on-resistance.

Referring to FIGS. 4-13, the method of forming a device with a p-type cap on both sides is described. Referring to FIG. 4, a GaN buffer layer 15, a p-type GaN cap layer 14 (or p-type $Al_yGaN$ (0<y<1)), a GaN channel layer 13, a $Al_xGaN$ layer 12 and a p-type $Al_zGaN$ cap layer 9 are epitaxially grown on a substrate 16. The exposed surface of the p-type $Al_zGaN$ cap layer 9 and the top surface of each layer is Ga-faced. Referring to FIG. 5, the p-type $Al_zGaN$ cap layer 11 is etched to define a gate region where the p-type $Al_zGaN$ cap 11 is located. Referring to FIG. 6, a gate 17 with a schottky contact and source 18 and drain 19 with ohmic contacts are formed on the Ga-face to form an assembly. Referring to FIG. 7, a passivation layer 23 is applied to the exposed Ga-faces of the assembly. Referring to FIG. 8, a bonding layer 24 is applied to the passivation layer 23. Referring to FIG. 9, a carrier wafer 60 is attached to the bonding layer 24. Referring to FIG. 10, the substrate 16 is removed from the GaN layer 15. Within the GaN buffer layer an additional sacrificial layer can be included (not shown). This layer contains an etch stop layer which is not etched when the sacrificial layer is etched. When the sacrificial layer is used, after etching the substrate the sacrificial layer is etched selectively to ensure a planar N-face GaN surface. Referring to FIG. 11, the assembly is then flipped over so that the N-face is accessible. Referring to FIG. 12, the GaN buffer layer 15 is etched to form a recess that allows for access to the p-type GaN cap layer 14. A gate 17' is then deposited on the N-face of cap layer 14 within the recess and contacting the p-type GaN cap layer 14. Referring to FIG. 13, back side contact is made to the original front side source 18 and drain 19 ohmic contacts. Additionally, contact is made with the gate pad (not shown, because it is in the plane of the figure) and any other pads where contact is required.

Referring to FIG. 14, in an alternative embodiment of the device of FIG. 1, a layer of $Al_yGaN$ 20, where y>x, is grown in the access region surrounding the p-type cap. The layer of $Al_yGaN$ 20 can further enhance the 2DEG and conductivity under the access region. Thus the on-resistance may be lower than in the device shown in FIG. 1. The method of forming this device is similar to that described in FIG. 4-13 with the exception of selectively growing the layer of $Al_yGaN$ 20 after the etch of the p-type layer 11.

Referring to FIG. 15, in yet another variation of the device of FIG. 1, the access regions are doped. An intermediary step of making the device is shown. The doping is achieved by thermal diffusion of donor species into the access regions. A thin film dielectric 29 with a donor species, such as Si, $SiO_2$ or $SiN_x$ (in the case of Si dopant), is deposited onto the Ga-face access region of a III-nitride epitaxial layer structure. The thin film dielectric 29 can either be applied to the Ga-face or the N-face of the device. The material is annealed, such as at a temperature between about 300 and 900° C., which increases the 2DEG density in the access regions, thus resulting in lower on-resistance. In some embodiments, multiple diffusions are performed to mimic a lightly doped drain structure. In some embodiments, the thin film dielectric is removed after the annealing process.

Referring to FIG. 16, another embodiment of an enhancement mode III-nitride device with gating on both the Ga and N-faces is shown where the device is fluorine treated. In some embodiments, the Ga-face is a Ga-polar face and the N-face is an N-polar face. The device includes a region on both the Ga-face beneath the gate 17 and a region on an N-face beneath the gate region that has been treated with a fluorine compound. The fluorine treatment can be a fluorine based plasma treatment. A fluorine treatment on both the Ga-face and the N-face increases the internal barrier and the threshold voltage of the device.

The structure under the gate is a layer of $Al_yGaN$ 25 on a GaN channel layer 13 on a layer of $Al_xGaN$ 21, which is on a GaN buffer layer 15. A recess in the GaN buffer layer 15 exposes a portion of the layer of $Al_xGaN$ 21. The recess is below the gate 17 and not below the access region. The exposed portion of the layer of $Al_xGaN$ 21 is treated with a plasma of a fluorine compound. Similarly, a gate region of the layer of $Al_yGaN$ 25 is treated with the plasma. The fluorine-based treatment is not applied to the access regions.

In some embodiments, a bottom gate 17' is formed in the recess after the fluorine treatment of the N-face. In some embodiments, the Al composition, x, in the $Al_xGaN$ layer 21 is minimized, such as to between 0.1 to 0.3, for example, 0.1, and the thicknesses of the GaN channel layer 13 and the $Al_xGaN$ layer 21 are controlled to prevent depletion of the 2DEG or the formation of a parasitic channel at the interface between the layer of $Al_xGaN$ 21 and GaN buffer layer 15. In some embodiments, the GaN channel layer 13 has a thickness of about 20 nm. In some embodiments, the thickness of the $Al_xGaN$ layer 21 is 10 nm. Optionally, the device includes an insulator 27 between the gate 17 and the layer of $Al_yGaN$ 25 and/or between the bottom gate 17' and the layer of $Al_xGaN$ 21. The insulator can have a thickness of between about 0.1 nm and 100 nm. In some embodiments, one of the gates 17, 17' is optional.

Referring to FIG. 17, the band diagram under the gate regions of a device with fluorine treatment under N-face and Ga-face gates shows an internal barrier of 0.8 eV (at minimum distance 90). A possible mechanism of the shift in threshold voltage on which the band diagram is based is that F ions act as acceptors. The fluorine-based plasma treatment results in high gate turn-on voltage and reduction of gate leakage current. Referring to FIG. 18, the band diagram in the access region shows a high 2DEG that will result in a low on-resistance.

In some embodiments, the fluorine based plasma treatment is combined with the device shown in FIG. 1, a p-type cap device. The fluorine based treatment can be applied to both the Ga-face and N-face surface. Alternatively, one surface can be p capped and the opposite surface can be treated with a fluorine treatment. This combination results in a device with a high internal barrier and a high threshold voltage while maintaining low on-resistance.

N-Face Devices

Referring to FIG. 19, a number of the devices described above are formed as Ga-face devices. A Ga-face device has a crystal structure with gallium atoms on its exposed face. A Ga-face structure can be Ga-polar, semi-polar or a non-polar GaN structure. Referring to FIG. 20, when a layer of AlGaN is deposited onto a layer of GaN, a 2DEG automatically forms because of the built-in sheet charge and electric fields in the heterostructure. Thus, Ga-face devices naturally tend to form depletion mode devices. The methods described above allow the Ga-faced devices to be enhancement mode devices. Many conventional III-nitride type devices are Ga-faced because a Ga-faced device can be easier to grow.

Referring to FIG. 21, a device with a crystal structure with N atoms exposed or on its face is referred to as an N-face device. The device can be N-polar, semi-polar or non-polar. Referring to FIG. 22, when a layer of AlGaN is deposited onto a layer of GaN, there is no spontaneous polarization in the heterostructure that causes the device to be a depletion mode device. Therefore, N-faced devices can be more easily made enhancement mode.

Referring to FIG. 23, an N-face device is formed with a p-type cap under the gate. The device has an epitaxial layer structure of a substrate 16 that includes a GaN layer 15, an $Al_xGaN$ layer 43 and a GaN channel layer 41 (bottom to top). The 2DEG is in the GaN channel layer 41. A p-type cap 11 of $Al_zGaN$, 0<z<1, is grown thick enough, such as at least 10 Angstroms, or in some instances as thin as p-type material growth allows, so that the raised barrier height due to the surface pinning position of the p-$Al_zGaN$ and barrier induced by the p-$Al_zGaN$/GaN hetero-interface depletes the 2DEG at the GaN channel layer 41/$Al_xGaN$ layer 43 interface under the gate region at zero gate bias. Because the p-$Al_zGaN$ increases the gate barrier height, the gate turn-on voltage increases and the gate leakage current decreases. To further reduce gate leakage, a thin, e.g., a layer less than 100 Angstroms, AlN layer can be included under the p-type $Al_zGaN$ cap and above the GaN channel 41 in the gate region. This AlN layer can also be within the p-type cap. In some embodiments the AlN layer is doped p-type or is an $Al_wGaN$ layer with a high Al composition (w>x).

In some embodiments, the GaN channel layer 41 is reduced to 5 nm to increase the internal barrier and the threshold voltage of the device. Referring to FIG. 24, the internal barrier of the device is at least 1.5 eV (at minimum distance 90).

Referring to FIG. 25, in some embodiments, the GaN channel layer 41 is thicker in the access region than in the gate region. Because the 2DEG density increases with the thickness of the GaN channel layer, the on-resistance of the device can be reduced by increasing the thickness of GaN channel layer 41. Thus, the GaN channel layer 41 can be grown to surround the p-type $Al_zGaN$ cap 11. The GaN channel layer 41 can also extend under the $Al_zGaN$ cap 11, but it can be thicker in the access region, up to 500 nm, such as about 30 nm. The thin portion under the gate can be about 5 nm in thickness.

Reducing the thickness of the GaN layer under the gate increases the barrier under the gate and hence, the threshold voltage. The thick portion in the access region allows for sufficient 2DEG at the GaN channel layer 41/$Al_xGaN$ layer 43 interface to result in minimum resistance in the access region. In some embodiments, the full thickness of the GaN channel layer 41 is grown first and then subsequently etched away, followed by the selective regrowth of the p-type $Al_zGaN$ cap 11. In other embodiments, a thinner GaN channel layer 41 is formed during the first structure growth and is then capped by a layer of $Al_zGaN$, followed by etching the layer of $Al_zGaN$ outside the gate region, i.e., in the access region and the regrowth of the remainder of GaN channel layer 41 in the access region. Referring to FIG. 26, the energy band diagram in the access region is shown. Without the high barrier of the p-$Al_zGaN$ cap 11, polarization in these layers allow for a 2DEG at the GaN channel/$Al_xGaN$ interface outside the gate region.

In alternative embodiments to the device shown in FIGS. 23 and 25, the p-type $Al_zGaN$ cap 11 is doped, such as with Mg or other p-type dopant. In some embodiments, the p-type $Al_zGaN$ cap 11 is a graded layer where z changes gradually, such as from 0 to 0.5. In some embodiments, in the p-type $Al_zGaN$ cap 11, z is 0.3 and has a thickness of about 5 nm. In some embodiments, the GaN channel layer 41 includes a small fraction of aluminum, thus forming a layer of $Al_yGaN$, where y is less than 0.15. The small amount of Al can improve the breakdown voltage of the device.

As noted above, formation of an N-face device is not necessarily as easy as growing a Ga-face device. Referring to FIGS. 27-29, a method of forming an N-face device, such as the device shown on FIG. 23, is described, wherein the original layers are grown as Ga-face layers and then flipped to realize the intended N-face device. Referring to FIG. 27, an epitaxial layer structure is grown in substrate 50. The epitaxial layer structure includes a thick GaN layer 55, an $Al_x$-GaN layer 43, a GaN channel layer 41, a p-type $Al_zGaN$ layer 9, and a GaN buffer 52, which are on the substrate 50 (from top to bottom). The epitaxial layer structure is grown as a Ga-face structure and is subsequently flipped. Thus, the thick GaN layer 55 eventually will serve as the buffer layer of the N-face device.

Referring to FIG. 28, a carrier wafer 60 is bonded onto the thick GaN layer 55 to form an assembly. The bond can be a metal based bond or a dielectric bond or other suitable bond. If the carrier wafer 60 will eventually serve as the final substrate, the carrier wafer can be thermally conducting and electrically insulating. In some embodiments, the bond between the carrier wafer 60 and the thick GaN layer 55 is not conductive.

Referring to FIG. 29, the assembly is flipped over so that the carrier wafer 60 is on the bottom of the device. The substrate 50 is removed using a technique suitable for the substrate material, such as laser liftoff for sapphire substrates, lapping or plasma etching for SiC based substrates or wet or dry etching for silicon substrates. The GaN buffer layer 52 is also removed, such as by a dry etch. The structure is now an N-face structure that is ready for completing to form the devices shown in FIGS. 27 and 30.

Referring to FIG. 30, in some embodiments, a multi-compositional cap 65 is formed under the gate of an N-face device. The epitaxial layer structure of the device is a channel layer of GaN 41 on a layer of $Al_zGaN$ 44 on GaN buffer layer 15, which is on substrate 16. The GaN channel layer 41 is thicker in the access region than in the gate region. In the gate region, a cap 65 is formed with either a graded composition of AlGaN or multiple layers of AlGaN, such as a layer of $Al_x$-GaN that is adjacent to the channel layer and a layer of $Al_yGaN$ that is adjacent to the gate 17, where y>x. In some embodiments, x=0.3 and y=0.5, and each of $Al_xGaN$ and $Al_yGaN$ are 5 nm thick. If the multi-compositional cap is graded, the grading can change from x to y in a continuous or discontinuous manner. The polarization and bandgap differences in the multi-compositional AlGaN layers increase the barrier height and deplete the 2DEG at the interface between the GaN channel layer 41 and the layer of $Al_zGaN$ 44 in the gate region at zero gate bias. As in FIG. 25, reducing the GaN channel layer thickness in the gate region also increases the threshold voltage. Further, because the multi-compositional AlGaN cap increases the gate barrier height, the gate turn-on voltage increases and the gate leakage current decreases in the device. Referring to FIG. 31, the multi-compositional cap in combination with the thinned GaN channel layer portion in the gate region can result in a device with at least a 1.4 eV internal barrier. Referring to FIG. 32, the access region of the device shows a high 2DEG concentration that enables low on-resistance.

Referring to FIG. 33, the device in FIG. 30 can be formed by starting with an epitaxial layer structure of a substrate 50 on which a GaN buffer layer 15, a layer of $Al_zGaN$ 44, a GaN channel layer 41, a layer of $Al_xGaN$ 67 and a layer of $Al_yGaN$ 69 are formed (from bottom to top). The structure is an N-face device. The $Al_yGaN$ layer 69 and $Al_xGaN$ layer 67 are then etched to form the cap 65. Additional GaN material is regrown around the cap 65, above the GaN channel 41. The gate 17, source 18 and drain 19 contacts then are formed. Alternatively, a structure with a thick GaN channel layer 41, a layer of $Al_zGaN$ 44 and a GaN layer 15 are epitaxially grown on substrate 16, as shown in FIG. 34. The thick GaN channel layer 41 is etched in the gate region and the cap 65, comprising of the materials of the layer of $Al_xGaN$ 67 and the layer of $Al_yGaN$ 69, is regrown (see FIG. 30).

Similar to the method shown in FIGS. 27-29, the multi-compositional cap device can also be formed by forming a Ga-face structure and flipping the structure. Referring to FIG. 35, an epitaxial layer structure including a thick GaN layer 55, a layer of $Al_zGaN$ 44, a GaN channel layer 41, a layer of $Al_xGaN$ 67, a layer of $Al_yGaN$ 69 and a GaN buffer 52 are formed on the substrate 50 (from top to bottom). The epitaxial layer structure is grown as a Ga-face and is subsequently flipped. Thus, the thick GaN layer 55 eventually will serve as the buffer layer of the N-face device.

Referring to FIG. 36, a carrier wafer 60 is bonded onto the thick GaN layer 55 to form an assembly. The bond can be a metal based bond or a dielectric bond. If the carrier wafer 60 will eventually serve as the final substrate, the carrier wafer can be thermally conducting and electrically insulating. However, the bond between the carrier wafer 60 and the thick GaN layer 55 is not conductive.

Referring to FIG. 37, the assembly is flipped over so that the carrier wafer 60 is on the bottom of the device. The substrate 50 is removed using a suitable method for the type of substrate, such as laser liftoff for sapphire substrates, lapping or plasma etching for SiC based substrates or wet or dry etching for silicon substrates. The GaN buffer layer 52 is also removed, such as by a dry etch. The structure is now an N-face structure that is ready for completing to form the device shown in FIG. 30.

In some embodiments, the layers of $Al_xGaN$ 67 and $Al_yGaN$ 69 are omitted in the initial growth and the GaN channel layer 41 is the final desired thickness for the access region, when it is applied to the layer of $Al_xGaN$ 67. The GaN channel layer 41 is then etched in the gate region and the cap 65 is formed where the GaN channel layer material was removed. In some embodiments, the device shown in FIG. 30 is formed without the regrown GaN material on the GaN channel layer 41. Thus, there is no recess in which the cap 65 is located.

Referring to FIG. 38, in some embodiments, an N-face device is formed by ion implanting the access region with n-type dopant ions, such as Si. Although only the device of FIG. 38 is shown as being doped, other structures described herein can be doped using this method. The access region portion of the $Al_xGaN$ layer 21 is ion implanted to increase the 2DEG density at the interface of the GaN channel layer 13 and the $Al_xGaN$ layer 21, outside the gate region. The resulting band structure in these regions force the electrons from the dopant ions to fall in the 2DEG at the interface of the GaN channel layer 13 and the $Al_xGaN$ layer 21.

Referring to FIGS. 39-41, alternative ways of forming a device with a p-type cap are shown. The p-type cap layer is a layer of $Al_yGaN$ 25 which extends from the source 18 to the drain 19 contacts. The layer GaN 31 is etched in the gate region to form layer GaN 32 and a gate is deposited such that the layer of GaN 32 is surrounding the gate 17 and on the p-type cap layer of $Al_yGaN$ 25. Hence, the layer of GaN 32 is only in the access region and increases the 2DEG in that region. The cap layer of AlyGaN 25 where not covered by the layer of GaN of the gate region, depletes the 2DEG to realize normally off operation. Source and drain contacts 18, 19 are deposited to complete the device, as shown in FIG. 39.

The devices shown in FIGS. 39 and 41 can be formed by starting with a stack of a GaN layer 15, a layer of $Al_xGaN$ 21, a GaN channel layer 13 and a layer of p-type $Al_yGaN$ 25, and a GaN layer 32, all grown on N-face layers. The polarization provided by the layer of GaN 32 in this N-face structure contributes to increasing the 2DEG. In some embodiments, the layer of GaN 32 has a thickness of at least 10 nm and thick enough to ensure charge in the access region. Referring back to FIG. 39, the layer of GaN 32 is etched in the gate region and left to remain in the access region. A gate electrode is deposited on the p-type $Al_yGaN$ layer 25 in the gate region. The etch back of the layer of GaN to form layer of GaN 32 results in depletion of the 2DEG under the gate region, making the device normally off. Source 18 and drain 19 ohmic contacts are also deposited.

Referring to FIG. 41, in some embodiments, an insulating layer 35 is deposited, such as by MOCVD, PECVD, ICP, E-beam or other suitable deposition method, over the etched layer of GaN 32 and between the gate 17 and the layer of p-type $Al_yGaN$ 25. The insulating layer 35 can further reduce gate leakage current increase gate turn on voltage and provide passivation. The insulating layer can be deposited either before or after forming the ohmic contacts for the source 18 and drain 19. If the insulating layer 35 is deposited before the formation of the ohmic contacts, portions of the layer can be removed or left in place where metallization is to be deposited for the ohmic contacts. Both the device of FIG. 39 and FIG. 41 device do not require a regrowth step.

Referring to FIG. 42, an N-face device is formed that has a selectively doped access region. The access region is doped by thermal diffusion of donor species from a dielectric (or other suitable) dopant diffusion layer 75 in the access region. The dopant diffusion layer 75 can include donor species, such as Si, $SiO_2$, $SiN_x$ and other suitable donor species. The dopant diffusion layer 75 is annealed to cause the dopant (Si in case of Si, $SiO_x$ or $SiN_x$) to migrate into the device and increase the 2DEG density in the access regions, thereby causing the device to have a lower on-resistance. The thermal diffusion can be carried out at any suitable temperature, for example between about 300 and 1000° C. To enhance the breakdown voltage of the device, multiple diffusions can be performed to mimic a lightly doped drain structure. In some embodiments, the dopant diffusion layer 75 is removed after annealing.

Referring to FIG. 43, in an alternative embodiment to the device in FIG. 42, instead of a dopant diffusion layer 75, a dielectric layer which functions as a Fermi level pinning layer 78 is applied on the device. The pinning layer 78 can be either doped or undoped. The pinning layer 78 induces charge in the access region. Referring to FIG. 44, in some embodiments the pinning layer is not only in the access region, but is also formed on the p-type $Al_zGaN$ cap 11. The cap 11 blocks any effects from the pinning layer 78 on the device in the gate region and thus the pinning can be on the cap without adversely causing a 2DEG in the gate region. The pinning layer 78 can be a layer of $SiN_x$, such as a layer of $SiN_x$ grown by MOCVD, PECVD, CATCVD or other suitable means, including a combination of various deposition techniques. $SiN_x$ on N-face or Ga-face III-nitride devices can pin the surface Fermi level close to the conduction band, resulting in high electron concentration and increased conductivity under the $SiN_x$ region. The pinning layer 78 can be deposited at any suitable step in the fabrication sequence of the device, such as before the ohmic metal contacts are deposited or after. The pinning layer can be removed from the gate, source or drain contacts where electrical contact will be made.

FIGS. 45-48 show a variety of features that can be used with any of the devices described herein. Although the devices shown are N-face devices, the features can also be used with Ga-face devices.

Referring to FIG. 45, a $SiN_x$ cap 80 can be applied to the N-face of the cap during an early stage of processing and is selectively removed at a desired step in the process. N-face III-nitride devices can be more susceptible to damage than Ga-face III-nitride devices. Thus, the $SiN_x$ cap 80 serves to protect the N-face surface from undesired damage during processing. The $SiN_x$ cap 80 can be thin, such as less than 2000 Angstroms, for example, 100 Angstroms. In some embodiments, part of the $SiN_x$ cap 80 is left in the gate region to function as a gate insulator.

Referring to FIG. 46, in some embodiments, a dielectric passivation layer 83 is formed on an N-face device. The passivation layer 83 can be $SiN_x$ or other suitable passivation material. The passivation material can be deposited by CVD, such as PECVD, MOCVD or ICP or by evaporation. In addition, an optional field plate 87 is formed over the gate region to reduce the peak electric field and help trapping and breakdown voltage capacity. The field plate 87 can be terminated at the source or at the gate.

Referring to FIG. 47, a slant field plate 93 can be applied to an N-face device. The slant field plate 93 maximizes breakdown voltage. The slant field plate can be applied along with a dielectric passivation layer 83. In some embodiments, such as the embodiment shown, the slant field plate 93 is integrated with the gate.

Referring to FIG. 48, a device can be formed with a gate insulator 96 and/or an AlN inter-layer 97 between the GaN channel layer 41 and the $Al_xGaN$ layer 43. The gate insulator 96 is between the gate and the top semiconductor layer, such as the p-type cap or the channel layer. The gate insulator can minimize gate leakage. The gate insulator 96 is formed of a suitable insulating material, such as $SiN_x$, $SiO_2$ or AlN. The layer of AlN 97 between the GaN channel layer 41 and the $Al_xGaN$ layer 43 is thin, such as greater than 0 to about 30 Angstroms. This layer improves the mobility-2DEG density product, resulting in a device with lower resistance.

Throughout the specification and in the claims, where III-nitride materials are described, a modification of the material may be used in its place so long as the material is not modified in such a way to reverse the intended polarization, e.g., by hindering the 2DEG in an access region or by inducing charge in the gate region. For example, where use of GaN is described, small amounts of aluminum or indium, e.g., up to 15%, 10%, 5% or 2% may be included in the GaN layer without deviating from the scope of the disclosed methods and devices. Similarly, where AlGaN materials are described, AlInGaN materials can be used in their place. That is, any of the GaN materials that are described can be replaced by secondary, tertiary, or quaternary materials, which are based on varying the amounts of the III type material of AlInGaN, Al, In and Ga, from 0 to 1, or $Al_xIn_yGa_{1-x-y}N$. When $Al_xGaN$ material is described, $0<x<1$, $Al_xGa_{1-x}N$ can be substituted. Further, when a subscript for a group III material is used in the specification, such as x, y or z, a different letter may be used in the claims. Throughout the specification, $>$ or $<$ may be substituted by $\geq$ or $\leq$, respectively and $\geq$ or $\leq$ can be substituted by $>$ or $<$, respectively.

Throughout the specification and in the claims, the $Al_xGaN$ layer adjacent to the channel layer and responsible for forming a heterostructure with and 2DEG in the channel layer, can be doped at least in part. In embodiments, the doping is n-type. Throughout the specification, the GaN buffer layer is generally semi-insulating but in some embodiments may include a small portion, such as a portion furthest from the substrate side of the buffer layer, that is doped. This doping can be either n-type or p-type.

The devices described herein can be formed on a substrate of sapphire, silicon carbide (either Si-face or C-face), silicon, aluminum nitride, gallium nitride or zinc oxide. Although not shown in the various epilayer structure schematics, a transition layer or a nucleation layer can be formed on the substrate to facilitate the growth of the III-nitride layers. The nucleation layer is specific to the type of substrate used.

In many embodiments, a cap is only in the gate region and not in the access region. However, in other embodiments, the cap extends across the access region as well.

Reference is made to fluorine treatment throughout the specification. This treatment may result in fluorine doping in the semiconductor layers.

Many intermediary structures are described herein, which are subsequently finished by depositing a gate metal and source and drain ohmic contacts. Further, individual devices can be isolated when multiple devices are formed on a single substrate. Where these steps are not explicitly stated, it is assumed that one would finish the device using known techniques.

The transistors described herein are power transistors, which are capable of blocking at least 600 V, such as at least 900 V or at least 1200 V.

A number of embodiments of the invention have been described. Nevertheless, it will be understood that various modifications may be made without departing from the spirit and scope of the invention. For example, many of the features described with one embodiment may be used with another embodiment. Accordingly, other embodiments are within the scope of the following claims.

What is claimed is:

1. A normally off III-nitride HEMT device, comprising:
    a gate;
    a source and a drain; and
    an access region formed of a III-nitride material between either the source and the gate or the drain and the gate, wherein the access region sheet resistance is less than 750 ohms/square;
    wherein the device has an internal barrier under the gate of at least 0.5 eV when no voltage is applied to the gate; and
    the device is capable of supporting a 2DEG charge density under the gate of greater than $1\times10^{12}/cm^2$ in the on state.

2. The device of claim 1, wherein the device is capable of blocking at least 600 V.

3. The device of claim 2, wherein the device has an on-resistance of less than 10 mohm-cm$^2$.

4. The device of claim 2, wherein the device has an on-resistance of less than 2 mohm-cm$^2$.

5. The device of claim 1, wherein the device is capable of blocking at least 1200 V.

6. The device of claim 5, wherein the device has an on-resistance of less than 15 mohm-cm$^2$.

7. The device of claim 5, wherein the device has an on-resistance of less than 3 mohm-cm$^2$.

8. The device of claim 1, wherein the device is an N-face device.

9. The device of claim 1, wherein the device is a GA-face device.

* * * * *